US012707882B2

(12) United States Patent
Lu et al.

(10) Patent No.: US 12,707,882 B2
(45) Date of Patent: Aug. 11, 2026

(54) QUANTUM DOT MATERIAL, LIGHT-EMITTING DEVICE AND METHOD OF MANUFACTURING THE SAME, AND DISPLAY APPARATUS

(71) Applicant: BOE TECHNOLOGY GROUP CO., LTD., Beijing (CN)

(72) Inventors: Shaoyong Lu, Beijing (CN); Zhuo Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 402 days.

(21) Appl. No.: 18/262,965

(22) PCT Filed: Jul. 13, 2022

(86) PCT No.: PCT/CN2022/105556
§ 371 (c)(1),
(2) Date: Jul. 26, 2023

(87) PCT Pub. No.: WO2024/011464
PCT Pub. Date: Jan. 18, 2024

(65) Prior Publication Data
US 2025/0024750 A1 Jan. 16, 2025

(51) Int. Cl.
*H10K 85/30* (2023.01)
*C09K 11/02* (2006.01)
(Continued)

(52) U.S. Cl.
CPC .......... *H10K 85/381* (2023.02); *C09K 11/025* (2013.01); *C09K 11/883* (2013.01);
(Continued)

(58) Field of Classification Search
CPC ...... H10K 50/115; H10K 71/12; H10K 85/30; H10K 85/381; C09K 11/02; C09K 11/025;
(Continued)

(56) References Cited

U.S. PATENT DOCUMENTS

2011/0226995 A1* 9/2011 Tulsky .................. B82Y 15/00 252/301.36
2018/0217496 A1 8/2018 Qi et al.
2022/0165952 A1* 5/2022 Mei ...................... H10K 71/211

FOREIGN PATENT DOCUMENTS

CN 102239108 A 11/2011
CN 105929635 A 9/2016
(Continued)

OTHER PUBLICATIONS

Nicholas D. Carbone et al., Kinetics and Mechanisms of Radical-Based Branching/Cross-Linking Reactions in Preformed Polymers Induced by Benzophenone and Bis-Benzophenone Photoinitiators, Macromolecules, Jul. 3, 2013, pp. 5434-5444, vol. 46, Issue 14, American Chemical Society. Available at URL: https://doi.org/10.1021/ma4007347.
(Continued)

*Primary Examiner* — Brook Kebede
(74) *Attorney, Agent, or Firm* — XSENSUS LLP

(57) ABSTRACT

A quantum dot material includes: quantum dot bodies and a ligand material coordinated to the quantum dot bodies; the quantum dot material further includes: a cross-linking agent, the cross-linking agent includes at least two photoresponsive group and a linking group bonding the at least two photoresponsive groups. Under light illumination, each photoresponsive group in the at least two photoresponsive groups is bonded to the ligand material by a carbon-hydrogen insertion reaction to form a cross-linked ligand material; a
(Continued)

solubility of the cross-linked ligand material in a solvent is less than a solubility of the ligand material and the cross-linking agent in the solvent.

20 Claims, 10 Drawing Sheets

(51) Int. Cl.

| | |
|---|---|
| ***C09K 11/88*** | (2006.01) |
| *B82Y 20/00* | (2011.01) |
| *B82Y 40/00* | (2011.01) |
| *H10K 50/115* | (2023.01) |
| *H10K 71/12* | (2023.01) |

(52) U.S. Cl.
CPC ............... *B82Y 20/00* (2013.01); *B82Y 40/00* (2013.01); *H10K 50/115* (2023.02); *H10K 71/12* (2023.02)

(58) Field of Classification Search
CPC ......... C09K 11/06; C09K 11/08; C09K 11/88; C09K 11/883; B82Y 20/00; B82Y 40/00
See application file for complete search history.

(56) References Cited

FOREIGN PATENT DOCUMENTS

| | | | |
|---|---|---|---|
| CN | 112410019 | A | 2/2021 |
| CN | 113972343 | A | 1/2022 |
| CN | 114672315 | A | 6/2022 |
| KR | 20210021897 | A | 3/2021 |

OTHER PUBLICATIONS

Gregory T. Carroll et al., Photoactive Additives for Cross-Linking Polymer Films: Inhibition of Dewetting in Thin Polymer Films, Langmuir, Aug. 5, 2006, pp. 7748-7754, vol. 22, Issue 18, American Chemical Society. Available at URL: https://doi.org/10.1021/la0611099.

Alexandre Welle et al., Tri- and Tetravalent Photoactivable Cross-Linking Agents, Synthesis, Jun. 18, 2012, pp. 2249-2254, vol. 44, Issue 14, Thieme. Available at URL: https://doi.org/10.1055/s-0031-1290444.

Min Je Kim et al., Universal three-dimensional crosslinker for all-photo-patterned electronics, nature communications, Mar. 23, 2020, vol. 11, Issue 1520, Nature. Available at URL: https://doi.org/10.1038/s41467-020-15181-4.

* cited by examiner

QUANTUM DOT MATERIAL, LIGHT-EMITTING DEVICE AND METHOD OF MANUFACTURING THE SAME, AND DISPLAY APPARATUS

CROSS-REFERENCE TO RELATED APPLICATION

The present application is a national phase entry under 35 USC 371 of International Patent Application No. PCT/CN2022/105556, filed on Jul. 13, 2022, which is incorporated herein by reference in its entirety.

TECHNICAL FIELD

The present disclosure relates to the field of display technologies, and in particular, to a quantum dot material, a light-emitting device and a method of manufacturing the same, and a display apparatus.

BACKGROUND

Light-emitting diodes such as organic light-emitting diodes (OLEDs) and quantum dot light-emitting diodes (QLEDs) have advantages such as self-illumination, wide viewing angle, fast response time, high luminous efficiency, low operation voltage, thin thickness of the substrate, capable of manufacturing a large-size and bendable substrate and simple manufacturing process, and have been more and more widely used in recent years.

SUMMARY

In an aspect, a quantum dot material is provided. The quantum dot material includes quantum dot bodies and a ligand material coordinated to the quantum dot bodies. The quantum dot material further includes a cross-linking agent, and the cross-linking agent includes at least two photoresponsive groups and a linking group bonding the at least two photoresponsive groups. Each photoresponsive group in the at least two photoresponsive groups is bonded, under light illumination, to the ligand material by a carbon-hydrogen insertion reaction to form a cross-linked ligand material. A solubility of the cross-linked ligand material in a solvent is less than a solubility of the ligand material and the cross-linking agent in the solvent.

In some embodiments, a molar extinction coefficient of the cross-linking agent is greater than 1 $cm^{-1}$ $(mol/L)^{-1}$ under ultraviolet light with a wavelength in a range of 200 nm to 400 nm.

In some embodiments, the cross-linking agent is selected from any one of structures represented by a following general formula (I).

(I)

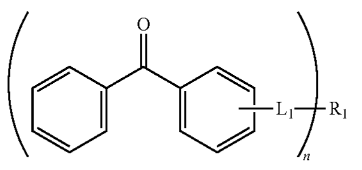

$L_1$ is selected from any one of an amide bond, ester bond and ether bond; $R_1$ is selected from any one of saturated or unsaturated straight or branched chain $C_1$-$C_{40}$ alkyl, $C_3$-$C_{40}$ cycloalkyl, $C_3$-$C_{40}$ heterocycloalkyl, $C_6$-$C_{40}$ aryl, and $C_6$-$C_{40}$ heteroaryl; a value of n is greater than or equal to 2.

In some embodiments, the value of n is selected from any one of 2, 3 and 4.

In some embodiments, a benzophenone group of the cross-linking agent represented by the general formula (I) is a photoresponsive group, and a carbonyl group of the benzophenone group is configured to be bonded, under light illumination, to the ligand material through a carbon-hydrogen insertion reaction.

In some embodiments, the ligand material adopts an organic ligand containing an alkyl carbon-hydrogen bond.

In some embodiments, the ligand material includes a coordination group and a carbon-hydrogen insertion group, and the ligand material is selected from any one of structures represented by a following general formula (II).

(II)

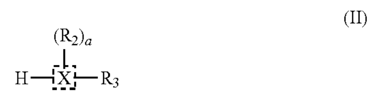

X is any one of a primary carbon group, a secondary carbon group and a tertiary carbon group, and XH is the carbon-hydrogen insertion group; $R_2$ is selected from any one of a saturated or unsaturated straight or branched chain $C_1$-$C_{40}$ alkyl, $C_3$-$C_{40}$ cycloalkyl, $C_3$-$C_{40}$ heterocycloalkyl, $C_6$-$C_{40}$ aryl, and $C_6$-$C_{40}$ heteroaryl; $R_3$ is selected from any one of a carboxyl group containing a $C_1$-$C_{40}$ carbon chain, an amino group containing a $C_1$-$C_4$a carbon chain, a mercapto group containing a $C_1$-$C_{40}$ carbon chain and an alkyl group containing a phosphorus atom, and $R_3$ is the coordination group used to be coordinated to a quantum dot body; a value of a is any one of 0, 1 and 2.

In some embodiments, the ligand material is selected from any one of organic acids, organic amines, organic phosphorus and organic thiols.

In some embodiments, the quantum dot body includes any one of Group IIB-VIA quantum dots, Group IIIA-VA quantum dots, Group IVA-VIA quantum dots, quantum dots with a core-shell structure, and perovskite quantum dots.

In some embodiments, a mass ratio of the cross-linking agent to the quantum dot bodies is in a range of 0.005 to 0.5, and a mass ratio of the cross-linking agent to the ligand material is in a range of 0.05 to 5.

In some embodiments, the mass ratio of the cross-linking agent to the quantum dot bodies is in a range of 0.01 to 0.1, and the mass ratio of the cross-linking agent to the ligand material is in a range of 0.1 to 1.

In some embodiments, a dielectric constant of the solvent is less than 10.

In another aspect, a quantum dot material is provided. The quantum dot material includes quantum dot bodies and a ligand material coordinated to the quantum dot bodies. The quantum dot material further includes a cross-linking agent, and the cross-linking agent includes at least two photoresponsive groups and a linking group bonding the at least two photoresponsive groups.

A structure of the cross-linking agent is selected from any one of structures represented by a following general formula (I).

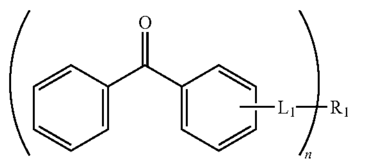

$L_1$ is selected from any one of an amide bond, ester bond and ether bond; $R_1$ is selected from any one of a saturated or unsaturated straight or branched chain $C_1$-$C_{40}$ alkyl, $C_3$-$C_{40}$ cycloalkyl, $C_3$-$C_{40}$ heterocycloalkyl, $C_6$-$C_{40}$ aryl, and $C_6$-$C_{40}$ heteroaryl; a value of n is greater than or equal to 2. The ligand material adopts an organic ligand containing an alkyl carbon-hydrogen bond.

In yet another aspect, a light-emitting device is provided. The light-emitting device includes a light-emitting layer, and the light-emitting layer includes a cross-linked quantum dot material with a network structure formed by the quantum dot bodies, the ligand material and the cross-linking agent in the quantum dot material as described in any one of the above embodiments.

In some embodiments, the cross-linked quantum dot material is selected from any one of structures represented by a following general formula (III).

(III)

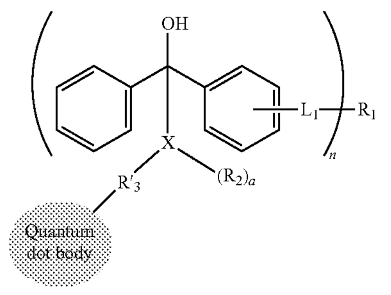

Among them, $L_1$ is selected from any one of an amide bond, an ester bond and an ether bond; $R_1$ is selected from any one of a saturated or unsaturated straight or branched chain $C_1$-$C_{40}$ alkyl, $C_3$-$C_{40}$ cycloalkyl, $C_3$-$C_{40}$ heterocycloalkyl, $C_6$-$C_{40}$ aryl, and $C_6$-$C_{40}$ heteroaryl; a value of n is greater than or equal to 2; X is any one of a primary carbon group, a secondary carbon group and a tertiary carbon group; $R_2$ is selected from any one of a saturated or unsaturated straight or branched chain $C_1$-$C_{40}$ alkyl, $C_3$-$C_{40}$ cycloalkyl, $C_3$-$C_{40}$ heterocycloalkyl, $C_6$-$C_{40}$ aryl, and $C_6$-$C_{40}$ heteroaryl; $R'_3$ is a group formed after the coordinating group $R_3$ is coordinated to the quantum dot body, $R_3$ is selected from any one of a carboxyl group containing a $C_1$-$C_2$ carbon chain, an amino group containing a $C_1$-$C_{20}$ carbon chain, a mercapto group containing a $C_1$-$C_{20}$ carbon chain and an alkyl group containing a phosphorus atom, and $R'_3$ is selected from any one of a structure where one hydrogen is removed from a carboxyl group, an amino group, a mercapto group or an alkyl group containing a phosphorus atom in $R_3$; a value of a is any one of 0, 1 and 2.

In some embodiments, each quantum dot body in the cross-linked quantum dot material is bonded to a plurality of groups $R'_3$, and the quantum dot bodies in the cross-linked quantum dot material are bonded by the cross-linking ligand material.

In some embodiments, the light-emitting layer includes a first sub-pixel film layer, a second sub-pixel film layer and a third sub-pixel film layer, and the first sub-pixel film layer, the second sub-pixel film layer and the third sub-pixel film layer are sequentially arranged in a first direction; the first direction is perpendicular to a plane where the light-emitting layer is located.

In some embodiments, the light-emitting device further includes a first electrode and a second electrode, and the light-emitting layer being disposed between the first electrode and the second electrode. The light-emitting device further includes an electron transporting layer, and the electron transporting layer is disposed between the first electrode and the light-emitting layer. The light-emitting device further includes a hole injection layer and a hole transporting layer; the hole injection layer and the hole transporting layer are stacked between the second electrode and the light-emitting layer, and the hole injection layer and the hole transporting layer are sequentially arranged in a direction far away from the second electrode.

In yet another aspect, a method of manufacturing a light-emitting device is provided. The method of manufacturing a light-emitting device includes forming a light-emitting layer. Forming the light-emitting layer includes: performing a coating process with a quantum dot material, the quantum dot material including the quantum dot material described in any one of the above embodiments; performing an exposure process on the quantum dot material under ultraviolet light; and performing a development process with a developing solution to form the light-emitting layer.

In some embodiments, the quantum dot material includes a first quantum dot material, a second quantum dot material and a third quantum dot material. The light-emitting layer includes a first sub-pixel film layer formed by the first quantum dot material, a second sub-pixel film layer formed by the second quantum dot material, and a second sub-pixel film layer formed by the third quantum dot material. Forming the first sub-pixel film layer, the second sub-pixel film layer and the third sub-pixel film layer includes: performing a coating process with the first quantum dot material; performing an exposure process on the first quantum dot material under ultraviolet light; performing a development process with a developing solution to form the first sub-pixel film layer; performing a coating process with the second quantum dot material; performing an exposure process on the second quantum dot material under ultraviolet light; performing a development process with a developing solution to form the second sub-pixel film layer; performing a coating process with the third quantum dot material; performing an exposure process on the third quantum dot material under ultraviolet light; and performing a development process with a developing solution to form the third sub-pixel film layer to obtain the light-emitting layer.

In yet another aspect, a display apparatus is provided, the display apparatus includes the light-emitting device as described in any of the above embodiments.

BRIEF DESCRIPTION OF THE DRAWINGS

In order to describe technical solutions in the present disclosure more clearly, the accompanying drawings to be used in some embodiments of the present disclosure will be introduced briefly below. Obviously, the accompanying drawings to be described below are merely some embodiments of the present disclosure, and a person of ordinary skill in the art can obtain other drawings according to these drawings. In addition, the accompanying drawings to be described below may be regarded as schematic diagrams and are not limitations on an actual size of a product, an actual process of a method and an actual timing of a signal to which the embodiments of the present disclosure relate.

DETAILED DESCRIPTION

Figure 1:
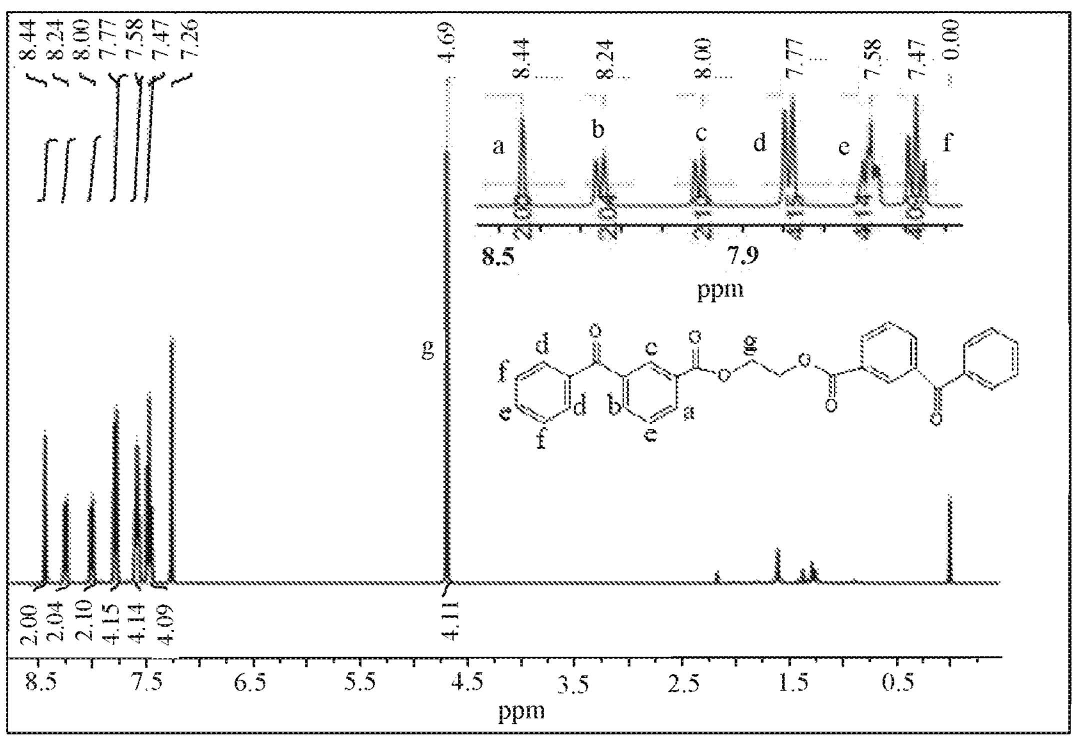
FIG. 1 is a nuclear magnetic hydrogen spectrum of ethane-1,2-diyl bis(3-benzoylbenzoate), in accordance with some embodiments of the present disclosure.

The technical solutions in embodiments of the present disclosure will be described clearly and completely with reference to the accompanying drawings. Obviously, the described embodiments are merely some but not all of embodiments of the present disclosure. All other embodiments obtained by a person of ordinary skill in the art based on embodiments in the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics described herein may be included in any one or more embodiments or examples in any suitable manner.

The terms"first" and "second" are used for descriptive purposes only, and are not to be construed as indicating or implying a relative importance or implicitly indicating a number of indicated technical features. Therefore, the features defined with "first" and "second" may explicitly or implicitly include one or more of these features. In the description of the embodiments of the present disclosure, "a plurality of" or "the plurality of" means two or more unless otherwise specified.

In the description of some embodiments, the term "connected" and extensions thereof may be used. For example, the term "connected" may be used in the description of some embodiments to indicate that two or more components are in direct physical or electrical contact with each other. The embodiments disclosed herein are not necessarily limited to the contents herein.

The phrase "at least one of A, B and C" has a same meaning as the phrase "at least one of A, B or C", and both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

In addition, the phase "based on" used is meant to be open and inclusive, since a process, step, calculation or other action that is "based on" one or more of the stated conditions or values may, in practice, be based on additional conditions or value exceeding those stated.

The terms "parallel", "perpendicular" and "equal" as used herein include the stated conditions and the conditions similar to the stated conditions, and the range of the similar conditions is within the acceptable deviation range, where the acceptable deviation range is determined by a person of ordinary skill in the art in consideration of the measurement in question and the error associated with the measurement of a specific quantity (i.e., the limitation of the measurement system). For example, the term "parallel" includes absolute parallelism and approximate parallelism, and an acceptable range of deviation of the approximate parallelism may be, for example, a deviation within 5°; the term "perpendicular" includes absolute perpendicularity and approximate perpendicularity, and an acceptable range of deviation of the approximate perpendicularity may also be, for example, a deviation within 5°. The term "equal" includes absolute equality and approximate equality, and an acceptable range of deviation of the approximate equality may be, for example, a difference between two equals of less than or equal to 5% of either of the two equals.

It will be understood that, in a case where a layer or component is referred to as being on another layer or a substrate, it may be that the layer or component is directly on the another layer or substrate; or it may be that intermediate layer(s) exist between the layer or component and the another layer or substrate.

Exemplary embodiments are described herein with reference to sectional views and/or plan views as idealized exemplary drawings. In the accompanying drawings, thicknesses of layers and sizes of regions are enlarged for clarity. Variations in shapes with respect to the accompanying drawings due to, for example, manufacturing technologies and/or tolerances may be envisaged. Therefore, the exemplary embodiments should not be construed as being limited to the shapes of the regions shown herein, but including deviations due to, for example, manufacturing. For example, an etched region shown as a rectangle shape generally has a curved feature. Therefore, the regions shown in the accompanying drawings are schematic in nature, and their shapes are not intended to show actual shapes of regions in a device, and are not intended to limit the scope of the exemplary embodiments.

As a new generation of optoelectronic materials, quantum dots have an important impact on many application fields such as display, lighting, laser, single photon source and biomedical imaging. In many device applications, the performance of quantum dots is mainly achieved through the integration of device units with a multi-layer nanocrystal stack structure. The construction of the integrated devices generally requires patterning of device unit films or arrays. For example, the construction of full-color quantum dot display devices depends on the precise patterning of red, green and blue light-emitting units. Therefore, the research of patterning quantum dots has a great significance for the construction of low-cost, large-area, and high-efficiency thin-film optoelectronic devices. At present, in response to the optoelectronic application requirements of quantum dots, a variety of patterning methods have been developed, such as inkjet printing, transfer printing, and photolithography.

Photolithography has developed into a mature technology in integrated circuit processing, which may provide a reference for the development of quantum dot photolithographic patterning methods. Although the patterning of quantum dots can be achieved by the traditional photolithography method, the further application of this method is limited due to the unresolved problems such as solvent compatibility. Moreover, the traditional photolithography method has the problem of cumbersome operation steps. Therefore, it is necessary to develop a new photolithography patterning method.

Based on this, a first aspect of the present disclosure provides a quantum dot material, and the quantum dot material includes quantum dot bodies and a ligand material coordinated to the quantum dot bodies. The quantum dot material further includes a cross-linking agent, and the crosslinking agent includes at least two photoresponsive groups and a linking group bonding the at least two photoresponsive groups. Under light illumination, each photoresponsive group of the at least two photoresponsive groups is bonded to the ligand material through a carbon-hydrogen (C—H) insertion reaction to form a cross-linked ligand material. A solubility of the cross-linked ligand material in a solvent is less than a solubility of the ligand material and the cross-linking agent in the solvent.

For example, the solvent is a solvent with a dielectric constant less than 10, such as toluene, chlorobenzene, n-hexane, n-octane, n-heptane, cyclohexane, methylene chloride, chloroform or tetrahydrofuran.

It will be noted that a medium will generate induced charges and weaken an electric field when the electric field is applied, a ratio of an electric intensity of the original applied electric field (in vacuum) to an electric intensity of the weakened electric field in the medium is the relative permittivity, it also known as electric inductivity, which is related to frequency. The dielectric constant is a product of the relative permittivity and an absolute permittivity in vacuum. If a material with a high dielectric constant is placed in the electric field, the electric intensity in the electrical medium will decrease appreciably. Here, the dielectric constant of the solvent is limited to be less than 10, which illustrates that the solvent includes most organic solvents, i.e., solvents that is able to dissolve the quantum dot bodies, ligand material and cross-linking agent are applicable.

For example, the ligand material is bonded to the quantum dot body through a coordinate bond.

That is to say, by using the above-mentioned cross-linking agent, under light illumination (e.g., ultraviolet light), the photoresponsive group of the cross-linking agent is bonded to the ligand material to form a cross-linked ligand material; moreover, the quantum dot bodies are bonded to the cross-linked ligand material through coordination bonds to form a cross-linked ligand material with a network structure. Compared with the solubility of the quantum dot bodies, the ligand material and the cross-linking agent in the solvent, a solubility of the cross-linked ligand material with the network structure in the solvent is greatly reduced.

Figure 5:
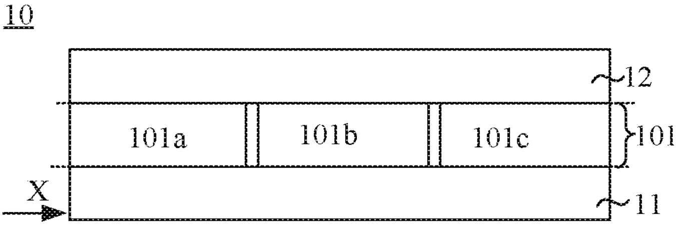
FIG. 5 is a diagram showing a structure of a light-emitting device, in accordance with some embodiments of the present disclosure.

Therefore, the quantum dot material provided in the present disclosure may be used to form a light-emitting layer 101 (as shown in FIG. 5, the specific manufacturing method of which will be described below, and will not be repeated here) of a light-emitting device 10 by a direct patterning method, so that the manufacturing method is simple and efficient, and the processing steps is shortened. Moreover, the existing ligand material on the quantum dot bodies is able to meet the requirements of the carbon-hydrogen insertion reaction. Thus, by using of the quantum dot material provided by the embodiments of the present disclosure, there is no need to exchange the ligand material on the quantum dot body, so that the processing is convenient.

In some examples, a molar absorption coefficient (also referred to as a molar extinction coefficient) of the cross-linking agent is greater than 1 $cm^{-1}$ $(mol/L)^{-1}$ under ultraviolet light with a wavelength in a range of 200 nm to 400 nm.

In a case where the molar absorption coefficient of the cross-linking agent is greater than 1 $cm^{-1}$ $(mol/L)^{-1}$, it indicates that the cross-linking agent has a significant photoresponse under the ultraviolet light with the wavelength in the range of 200 nm to 400 nm; the photoresponse here means that the cross-linking agent absorbs the ultraviolet light. Moreover, the higher the molar absorption coefficient, the more the cross-linking agent absorbs the ultraviolet light, and the higher the efficiency of forming the cross-linked ligand material by the carbon-hydrogen insertion reaction between the cross-linking agent and the ligand material.

A general structural formula of the cross-linking agent is introduced below.

In some examples, the cross-linking agent is selected from any one of structures represented by a following general formula (I).

(I)

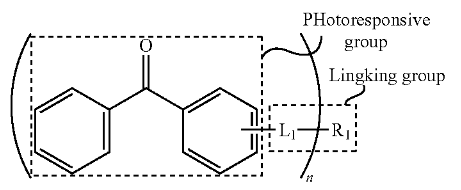

$L_1$ is selected from any one of an amide bond, ester bond and ether bond; $R_1$ is selected from any one of a saturated or unsaturated straight or branched chain $C_1$-$C_{40}$ alkyl, $C_3$-$C_{40}$ cycloalkyl, $C_3$-$C_{40}$ heterocycloalkyl, $C_6$-$C_{40}$ aryl, and $C_6$-$C_{40}$ heteroaryl, a value of n is greater than or equal to 2.

It will be noted that the carbon chain of $C_m$ refers to a carbon chain having m carbon (C) atoms in total. n represents the number of corresponding groups. The value of n is greater than or equal to 2, that is, n may be 2, 3 or 4, or a value greater than 4.

The benzophenone group of the cross-linking agent represented by the general formula (I) is the photoresponsive group, and a carbonyl group (—C═O) of the benzophenone group is configured to be bonded, under light illumination, to the ligand material through the carbon-hydrogen insertion reaction. A part of the cross-linking agent except for the photoresponsive groups is the linking group, and the linking group has the function of linking multiple photoresponsive groups.

Moreover, a molar absorption coefficient of benzophenone is greater than 1 $cm^{-1}$ $(mol/L)^{-1}$, and a molar absorption coefficient of a derivative of benzophenone represented by the general formula (I) is greater than 1 $cm^{-1}$ $(mol/L)^{-1}$.

The principle that benzophenone may be used as the cross-linking agent is described below.

Under light illumination, benzophenone photolyzes to form a triplet ketone intermediate, the structure of which is shown in the following formula. $C^-$—$O^-$ in the triplet ketone intermediate will attack the nearby organic molecules, and undergoes a carbon-hydrogen insertion reaction, and then, benzophenone is bonded to the nearby organic molecules through covalent bonds, which as shown in the following formula.

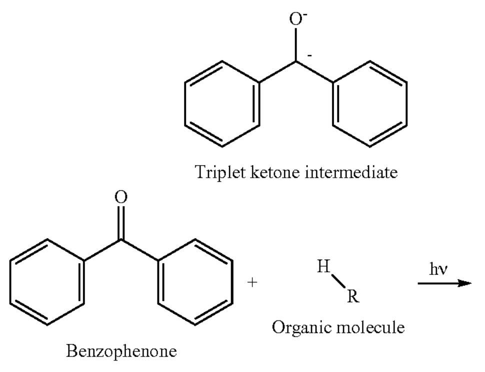

Triplet ketone intermediate

Benzophenone

Organic molecule

-continued

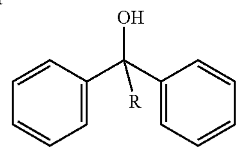

$h\nu^-$ indicates that under the action of light illumination, i.e., under the ultraviolet light, benzophenone and organic molecules undergo a carbon-hydrogen insertion reaction to form a compound linked by covalent bonds. Therefore, in a case where there are two or more benzophenones in one molecule, the molecule may act as a cross-linking agent, and eventually form a network with the target molecule, thereby changing the solubility of the target molecule. It will be noted that the target molecule refers to an organic molecule that is able to undergo a carbon-hydrogen insertion reaction with benzophenone.

Therefore, in the embodiments of the present disclosure, according to the processable properties of the quantum dot solution, a benzophenone derivative is introduced into the quantum dot solution as a cross-linking agent; a film-forming process (e.g., a spin coating process) is performed with the quantum dots and the cross-linking agent that serve as a mixed ink to form a film, and then an exposure process and a development process are performed on the film, so that patterning of the quantum dots is directly achieved. Since the molecules in the cross-linking agent directly participate in the patterning of the quantum dots, compared with the traditional photoresist patterning method, there is no need to wash off a photoresist sacrificial layer, thereby simplifying the processing flow.

Moreover, benzophenone and derivatives thereof only have absorption in the ultraviolet band, and have no absorption in the luminous band of quantum dots, which does not affect the optical properties of the quantum dots, and may keep the light-emitting device 10 (as shown in FIG. 5) has a high fluorescent quantum dot yield.

The specific structure of the cross-linking agent will be illustrated below.

In some examples, in a case where the value of n is 2, the cross-linking agent contains two photoresponsive groups, and the cross-linking agent is selected from any one of structures represented by the following general formula (1-1).

(I-1)

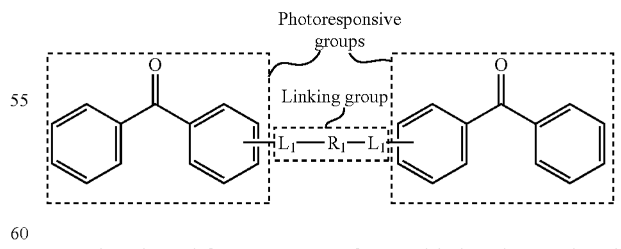

$L_1$ is selected from any one of an amide bond, ester bond and ether bond; $R_1$ is selected from any one of a saturated or unsaturated straight or branched chain $C_1$-$C_{40}$ alkyl, $C_3$-$C_{40}$ cycloalkyl, $C_3$-$C_{40}$ heterocycloalkyl, $C_6$-$C_{40}$ aryl, and $C_6$-$C_{40}$ heteroaryl.

For example, $L_1$ is a ester bond, $R_1$ is a straight chain alkyl, the structural formula of the cross-linking agent is represented by the following formula (T-1), and the exemplary structural formula represents ethane-1,2-diyl bis(3-benzoylbenzoate).

(T-1)

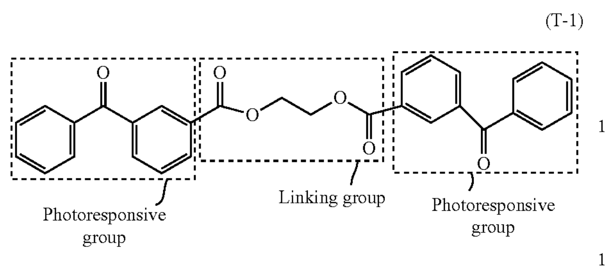

Under the light illumination, the two photoresponsive groups in the cross-linking agent represented by formula (T-1) may be bonded to the ligand material on the quantum dot bodies through the carbon-hydrogen insertion reaction, so that the quantum dot bodies are bonded together to form the cross-linked ligand material.

A synthesis method of the cross-linking agent represented by the structural formula (T-1) is introduced below, and a synthetic route of the cross-linking agent represented by the structural formula (T-1) is shown in the following formula.

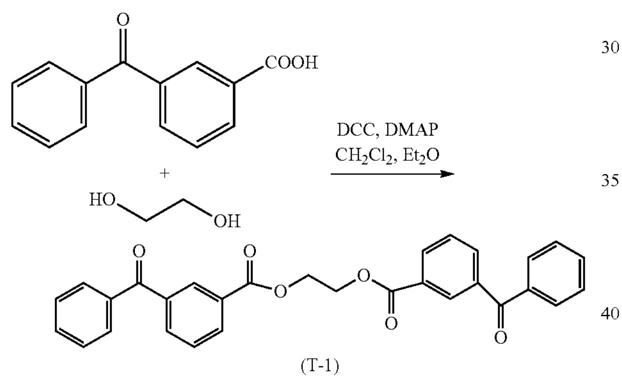

(T-1)

For example, 3-benzoylbenzoic acid (1.13 g) is dissolved in a mixed solution of dichloromethane ($CH_2Cl_2$, 85 mL) and ether ($Et_2O$, 15 mL), and N—N'-dicyclohexycarbodiimide (DCC, 2.08 g) and 4-dimethylaminopyridine (DMAP, 0.16 g) are added under stirring to continue the reaction for 10 minutes. Then, ethylene glycol (0.3 mL) is added, and then is heated to react under reflux for 10 hours. After that, filtering, and the filtrate is washed with water (3×30 mL) and then passed through acetic acid (2×30 mL), deionized water (2×30 mL), saturated saline (30 mL) and water (30 mL) respectively; next, the organic filtrate is dried with anhydrous sodium sulfate, and the solvent is removed by rotary evaporation, and the product ethane-1,2-diyl bis(3-benzoylbenzoate) (represented as T-1) is obtained, which is stored in a refrigerator in the dark.

The characterization data of the cross-linking agent, represented by the structural formula (T-1), prepared by the above synthesis route will be introduced below.

Nuclear magnetic hydrogen spectrum: as shown in FIG. 1, chloroform-d ($CDCl_3$) is used as a deuterated solvent, the liquid nuclear magnetic hydrogen spectrum information of the purified product ethane-1,2-diyl bis(3-benzoylbenzoate) (represented as T-1) is as follows: δ 8.44 (m, 2H), 8.24 (m, 2H), 8.00 (m, 2H), 7.77 (m, 4H), 7.58 (m, 4H), 7.47 (m, 4H), 4.69 (m, 4H); the impurity content is low, and the purity is high.

Figure 2:
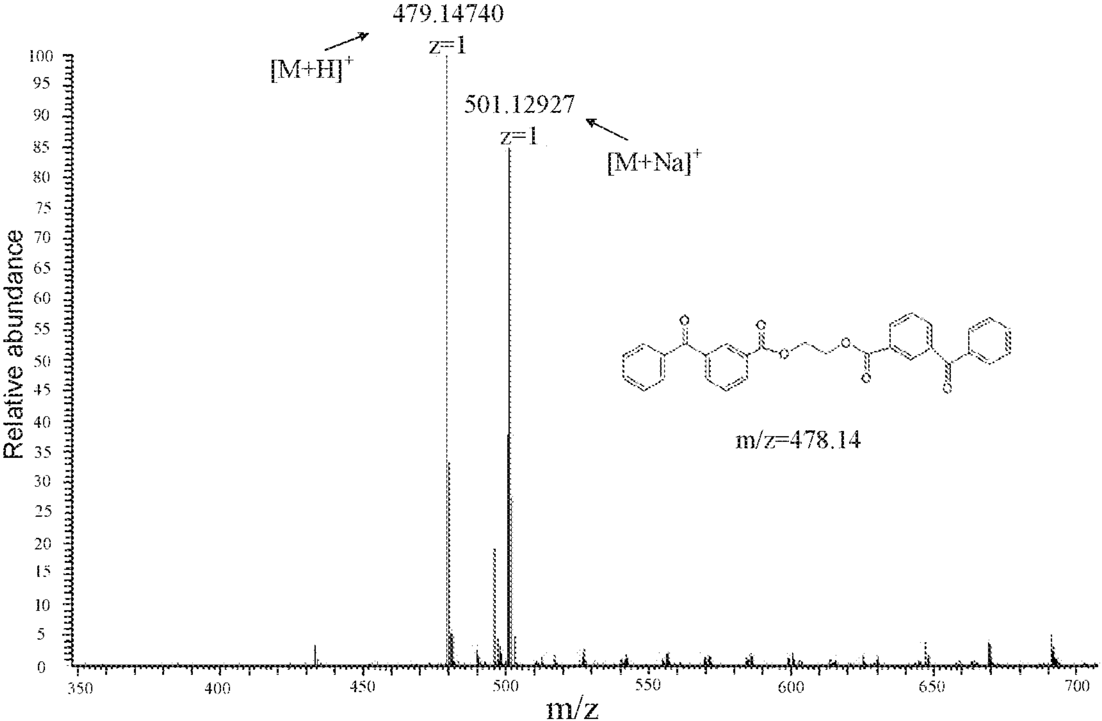
FIG. 2 is a mass spectrum of ethane-1,2-diyl bis(3-benzoylbenzoate), in accordance with some embodiments of the present disclosure.

Mass spectrum: as shown in FIG. 2, a mass-to-charge ratio (m/z) of 479.14740 is the molecular signal of protonated ethane-1,2-diyl bis(3-benzoylbenzoate) (represented as $[M+H]^+$), and a mass-to-charge ratio (m/z) of 501.12927 is the molecular signal of sodium ionized ethane-1,2-diyl bis(3-benzoylbenzoate) (represented as $[M+Na]^+$), which further confirms that the product ethane-1,2-diyl bis(3-benzoylbenzoate) (represented as T-1) is synthesized successfully.

Figure 3:
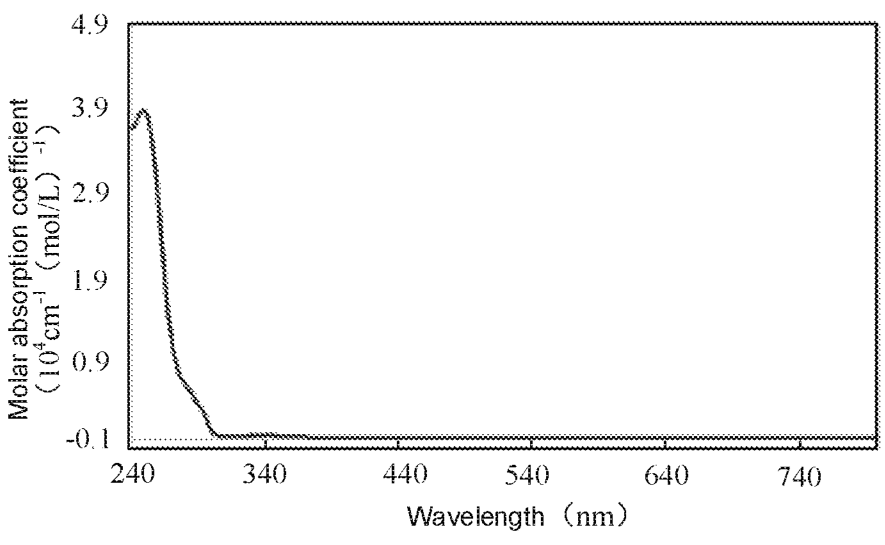
FIG. 3 is an ultraviolet-visible absorption spectrum of ethane-1,2-diyl bis(3-benzoylbenzoate), in accordance with some embodiments of the present disclosure.

Ultraviolet-visible absorption spectrum: as shown in FIG. 3, the ultraviolet-visible absorption spectrum characterization shows that the molar absorption coefficient of the product ethane-1,2-diyl bis(3-benzoylbenzoate) (represented as T-1) is $3.7\times10^4$ $cm^{-1}$ $(mol/L)^{-1}$ at 254 nm wavelength of the ultraviolet light. It can be seen that the molar absorption coefficient of ethane-1,2-diyl bis(3-benzoylbenzoate) under the ultraviolet light is greater than 1 $cm^{-1}$ $(mol/L)^{-1}$, which indicates that the cross-linked agent has a significant light response at 254 nm wavelength of the ultraviolet light. Moreover, the higher the molar absorption coefficient, the more the cross-linking agent absorbs the ultraviolet light, so that the efficiency of forming the cross-linking ligand material by the carbon-hydrogen insertion reaction between the cross-linking agent and the ligand material is high.

In some examples, in a case where the value of n is 3, the cross-linking agent contains 3 photoresponsive groups, and the cross-linking agent is selected from any one of structures represented by the following general formula (1-2).

(I-2)

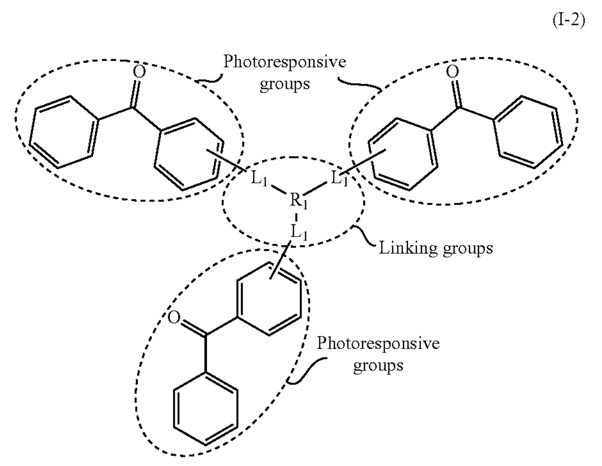

$L_1$ is selected from any one of an amide bond, ester bond and ether bond; $R_1$ is selected from any one of a saturated or unsaturated straight or branched chain $C_1$-$C_{40}$ alkyl, $C_3$-$C_{40}$ cycloalkyl, $C_3$-$C_{40}$ heterocycloalkyl, $C_6$-$C_{40}$ aryl, and $C_6$-$C_{40}$ heteroaryl.

For example, $L_1$ is an amide bond, $R_1$ is a $C_6$-$C_{40}$ aryl group, and the structural formula of the cross-linking agent is represented by the following formula (T-2).

(T-2)
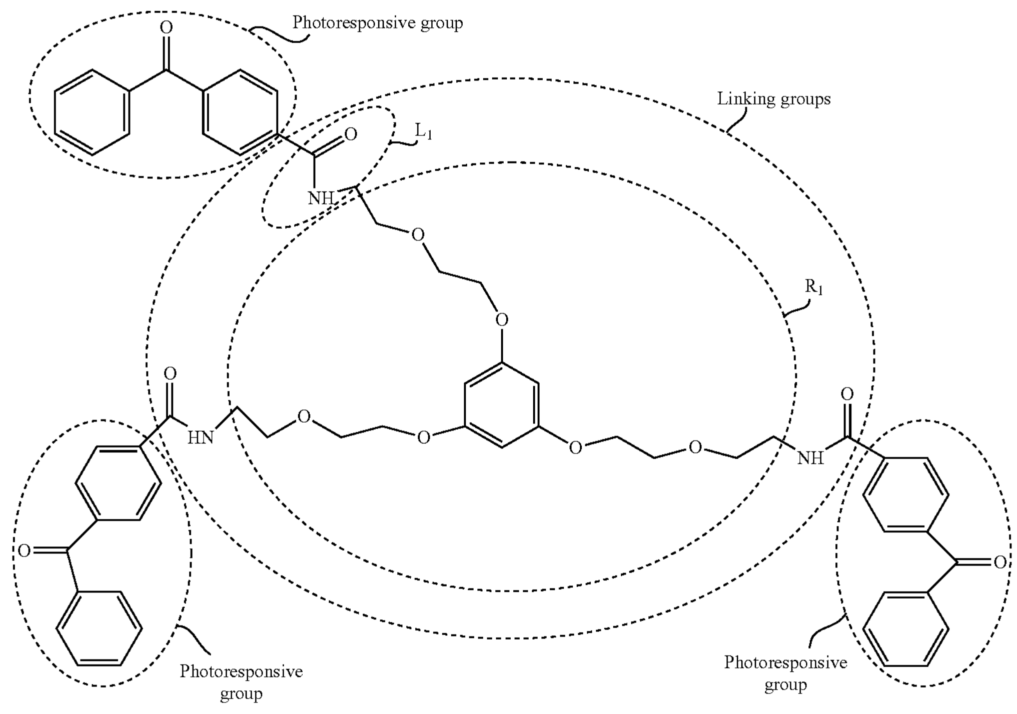
For example, $L_1$ is an amide bond, $R_1$ is a $C_6$-$C_{40}$ aryl group, and the structural formula of the cross-linking agent is represented by the following formula (T-3).
(T-3)
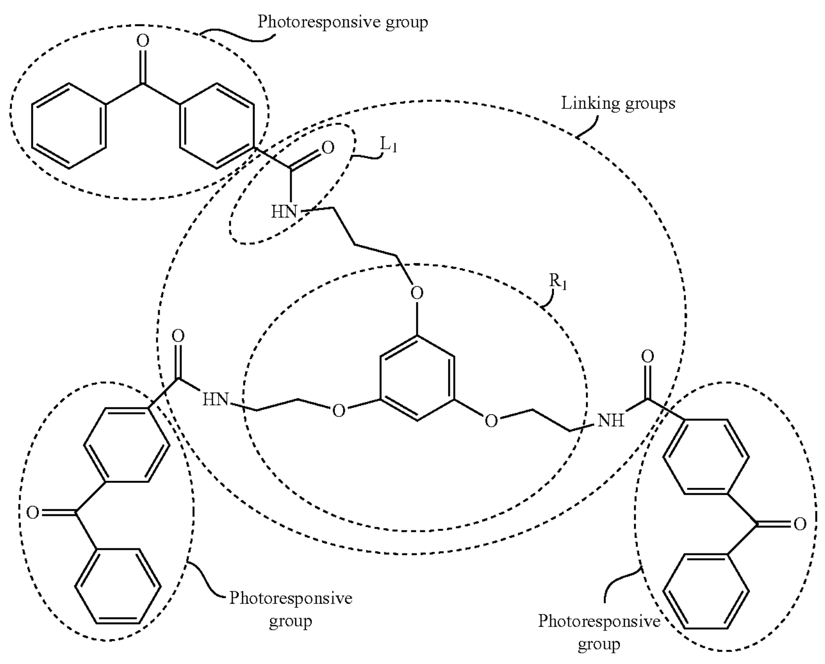
For example, $L_1$ is an ester bond, $R_1$ is a saturated branched chain $C_1$-$C_{40}$ alkyl group, and the structural formula of the cross-linking agent is represented by the following formula (T-4).

(T-4)

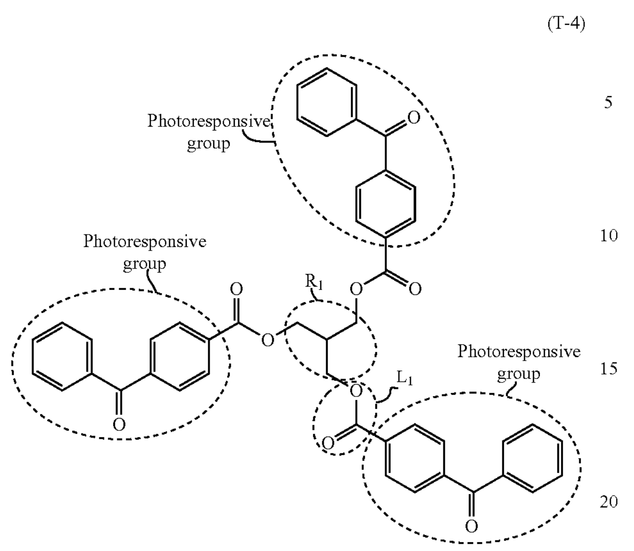

-continued

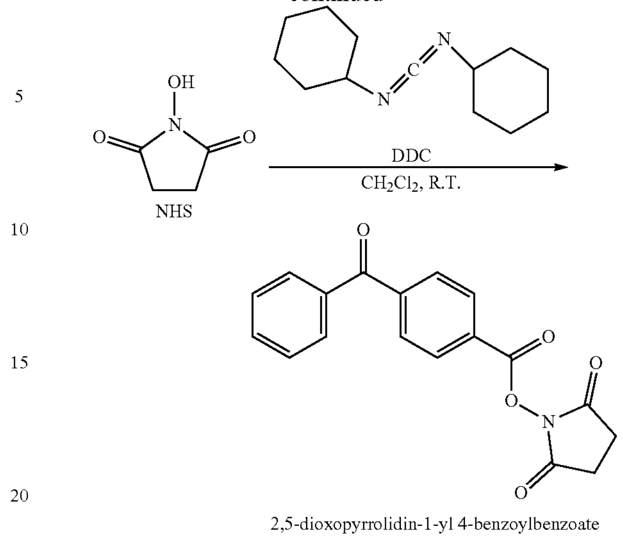

2,5-dioxopyrrolidin-1-yl 4-benzoylbenzoate

A synthesis method of the cross-linking agent represented by a structural formula (T-2) will be introduced below.

For example, first, 4-benzoylbenzoic acid (5.33 mmol, 1.20 g) is mixed with N-hydroxysuccinimide (NHS, 5.53 mmol, 636 mg) and dissolved in 20 mL of dichloromethane ($CH_2Cl_2$), a dehydration condensation agent N—N'-dicyclohexycarbodiimide (DCC, 5.64 mmol, 1.163 g) is added under vigorous stirring, and stirring overnight at room temperature (R.T.). After the solvent is removed by filtration, 2,5-dioxopyrrolidin-1-yl 4-benzoylbenzoate is obtained by purification with a polar column, and the chemical reaction formula is shown below.

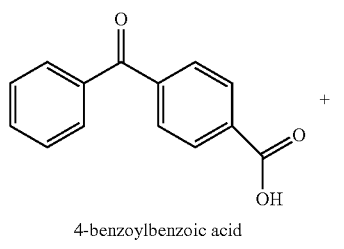

4-benzoylbenzoic acid

+

Then, phloroglucinol (190 mg, 1.5 mmol) and caesium carbonate ($Cs_2CO_3$, 806 mg, 2.45 mmol) are added to 10 mL of methanol (MeOH), stirring at 45° C. for 30 minutes in a nitrogen atmosphere. Next, the solvent is distilled off under reduced pressure to obtain a cesium phenol salt product, which is beneficial to a nucleophilic substitution reaction in a next step.

The product is dissolved in N,N-dimethylformamide (DMF, 30 mL) and continued to be heated to 60° C. under the nitrogen atmosphere, so as to provide an inert environment and a high heating temperature for the synthesis of Product 1. A DMF solution (12 mL) dissolved with 2-(2-((tert-Butoxycarbonyl)amino)ethoxy)-ethyl 4-methylbenzenesulfonate (1.67 g, 4.65 mmol) are added dropwise to the above solution, and stirring overnight at 60° C. The product is distilled under reduced pressure, and dissolved in 150 mL of dichloromethane ($CH_2Cl_2$), and then, successively washed twice with 30 mL of saturated sodium bicarbonate solution and twice with 30 mL of saturated brine, so as to remove the acidic gas during the reaction, which facilitates separation from an organic liquid during extraction. Dry with anhydrous magnesium sulfate, and then remove the solvent under vacuum to obtain Product 1, and the chemical reaction formula is shown below.

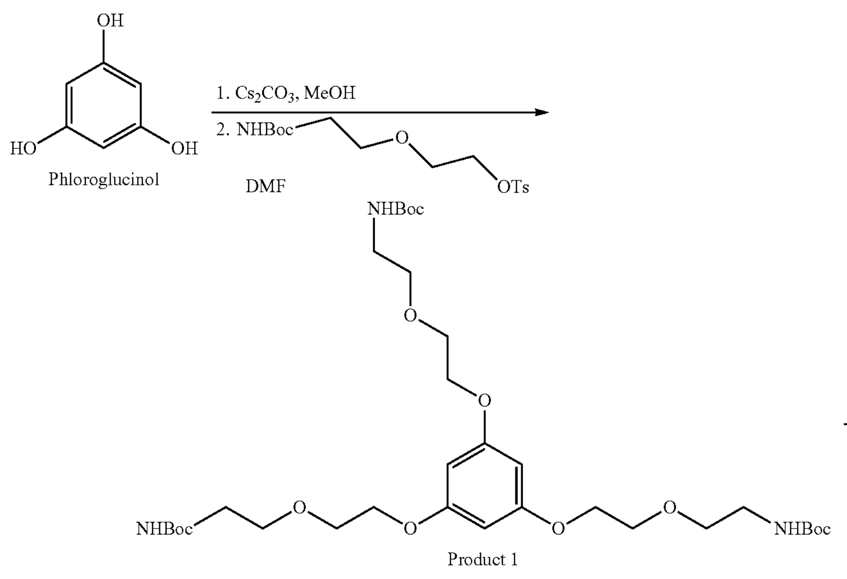

TFA
$CH_2Cl_2$

-continued

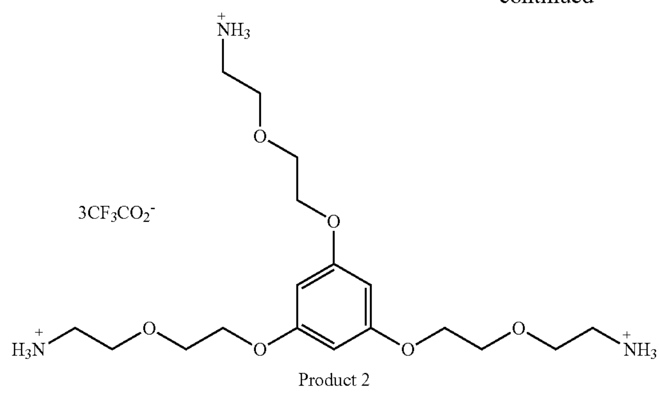

Product 2

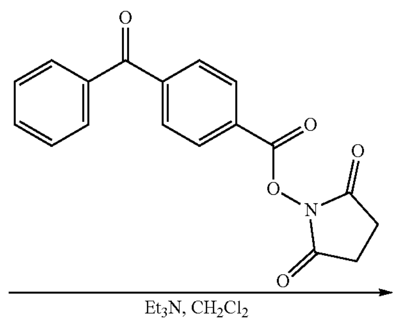

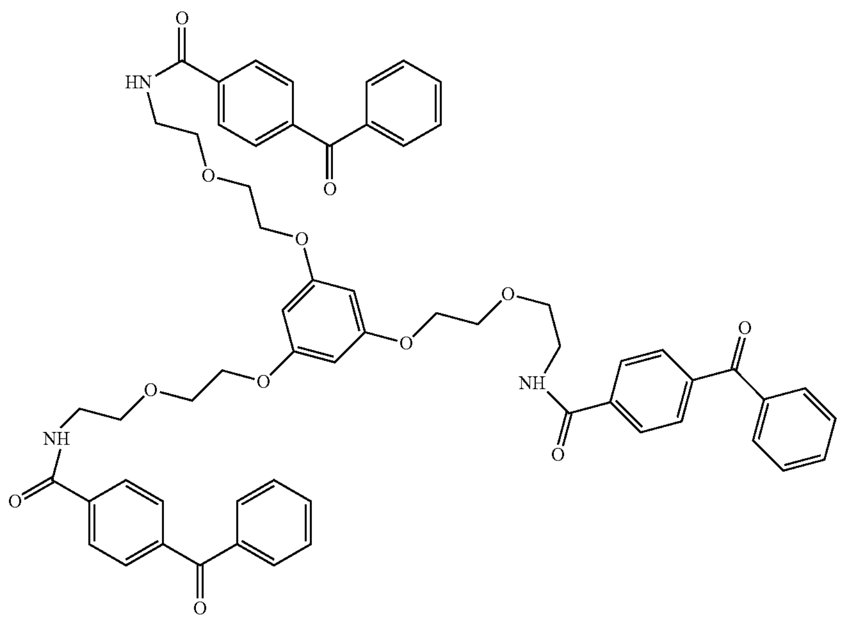

(T-2)

Product 1 (1 mmol) is dissolved in 5 mL of dichloromethane ($CH_2Cl_2$), and 5 mL of trifluoroacetic acid (TFA) is added. The above mixture reacts at room temperature for 2 hours, and then the solvent is distilled off under reduced pressure to obtain a quaternary ammonium salt (Product 2).

Product 2 (0.3 mmol) is dissolved in both dichloromethane ($CH_2Cl_2$, 20 mL) and triethylamine ($Et_3N$, 5 mL), and 2,5-dioxopyrrolidin-1-yl 4-benzoylbenzoate (1.2 mmol) is added with stirring, and continue stirring overnight. After the reaction solution is diluted with dichloromethane ($CH_2Cl_2$, 50 mL), the organic layer is successively washed twice with saturated sodium bicarbonate (5 mL) and twice with saturated brine (5 mL), dried with anhydrous sodium sulfate, and then the solvent is pumped dry under vacuum, so as to obtain Product 3 (i.e., the product containing three benzophenone groups), the structural formula of which is represented as (T-2).

It will be noted that, in the above chemical reaction formula, Ts refers to methyl p-toluenesulfonate.

A synthesis method of the cross-linking agent represented by a structural formula (T-4) will be introduced below, and the synthetic route of the cross-linking agent represented by the structural formula (T-4) is shown below.

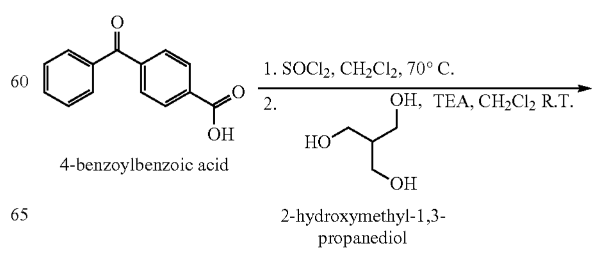

4-benzoylbenzoic acid 2-hydroxymethyl-1,3-propanediol

-continued

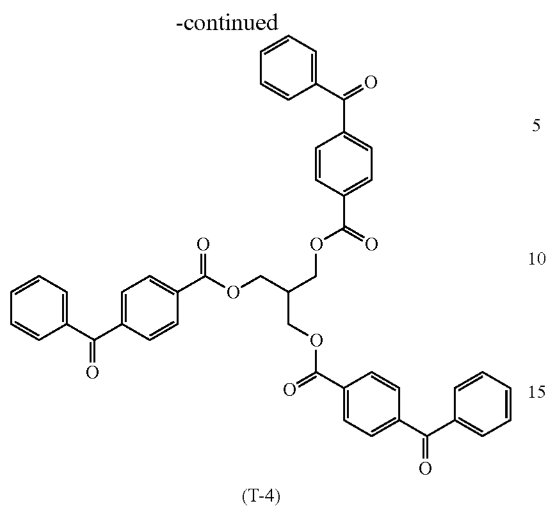

(T-4)

For example, 4-benzoylbenzoic acid (192 mg, 0.85 mmol) is mixed with a thionyl chloride ($SOCl_2$) solution (0.12 mL, 1.70 mmol) at a molar concentration of 1 mol/L, and then 2.4 mL of dichloromethane ($CH_2Cl_2$) is added, stirring to react under reflux at 70° C. for 12 hours. After the above reaction solution returned to at room temperature, the reaction solvent is distilled off under reduced pressure to obtain a crude product containing acid chloride. The above crude product is dissolved in 2.4 mL of dichloromethane ($CH_2Cl_2$), and then added to a mixed solution of 2-hydroxymethyl-1,3-propanediol (37 mg, 0.35 mmol), triethylamine (TEA, 86 mg, 0.85 mmol) and dichloro methane ($CH_2Cl_2$, 10 mL). After the reaction mixture is stirred at room temperature (R.T.) for 4 hours, 4 mL of water is added to terminate the reaction. The aqueous layer is extracted three times with dichloromethane ($CH_2Cl_2$, 10 mL). The organic layer is collected, washed with saturated brine (25 mL), and then dried with anhydrous magnesium sulfate. Then, the above organic solution is distilled under reduced pressure by a rotary evaporator, and purified by a silica gel column to obtain a product containing three benzophenone groups, the structural formula of which is represented by (T-4).

In some examples, in a case where the value of n is 4, the cross-linking agent contains 4 photoresponsive groups, and the cross-linking agent is selected from any one of structures represented by the following general formula (1-3).

(I-3)

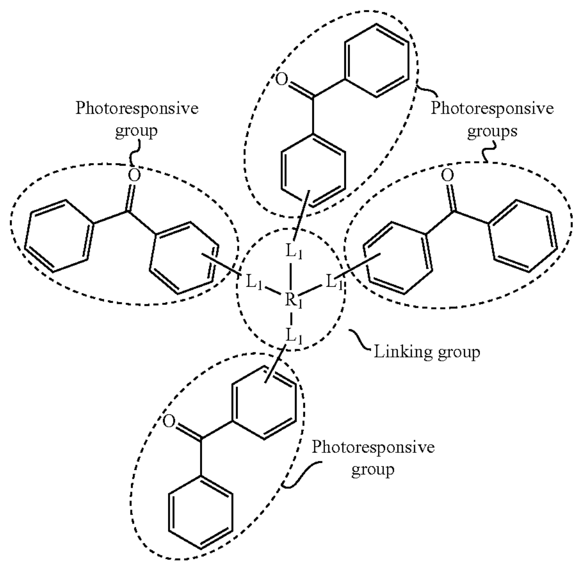

$L_1$ is selected from any one of an amide bond, ester bond and ether bond; $R_1$ is selected from any one of a saturated or unsaturated straight or branched chain $C_1$-$C_{40}$ alkyl, $C_3$-$C_{40}$ cycloalkyl, $C_3$-$C_{40}$ heterocycloalkyl, $C_6$-$C_{40}$ aryl, and $C_6$-$C_{40}$ heteroaryl.

For example, $L_1$ is an ester bond, $R_1$ is a saturated branched chain $C_1$-$C_{40}$ alkyl, and the structural formula of the cross-linking agent is represented by the following formula (T-5).

(T-5)

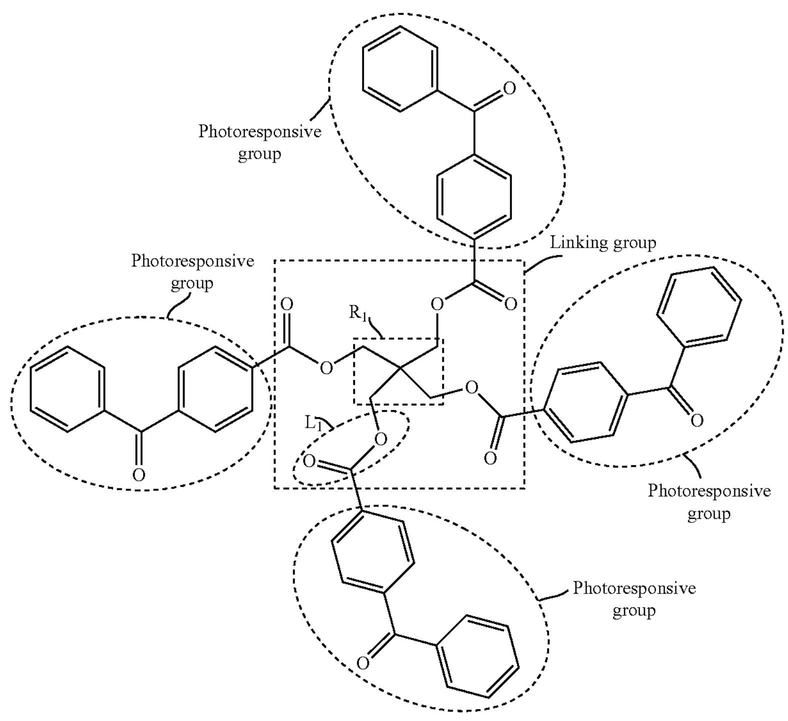

A synthesis method of the cross-linking agent represented by the structural formula (T-5) will be introduced below, and a synthetic route of the cross-linking agent represented by the structural formula (T-5) is shown below.

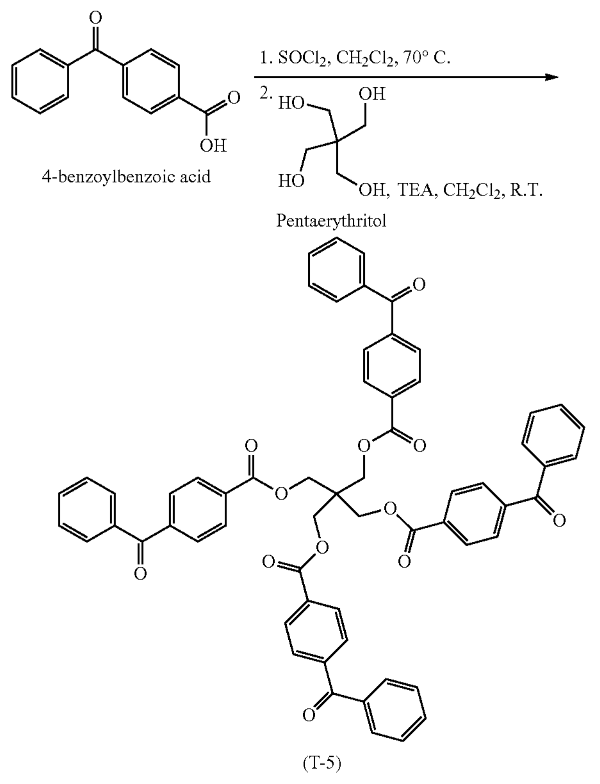

(T-5)

For example, 4-benzoylbenzoic acid (192 mg, 0.85 mmol) is mixed with a thionyl chloride ($SOCl_2$) solution (0.12 mL, 1.70 mmol) at a molar concentration of 1 mol/L, and then 2.4 mL of dichloromethane ($CH_2Cl_2$) is added, stirring to react under reflux at 70° C. for 12 hours. After the above reaction solution returned to at room temperature, the reaction solvent is distilled off under reduced pressure to obtain a crude product containing acid chloride. The above crude product is dissolved in 2.4 mL of dichloromethane ($CH_2Cl_2$), and added to a mixed solution of pentaerythritol (27 mg, 0.20 mmol), triethylamine (TEA, 86 mg, 0.85 mmol) and dichloromethane ($CH_2Cl_2$, 10 mL). After the reaction mixture is stirred at room temperature (R.T.) for 4 hours, 4 mL of water is added to terminate the reaction. The aqueous layer is extracted three times with dichloromethane ($CH_2Cl_2$, 10 mL). The organic layer is collected, washed with saturated brine (25 mL), and then dried with anhydrous magnesium sulfate. Then, the above organic solution is distilled under reduced pressure by a rotary evaporator, is and purified by a silica gel column to obtain a product containing four benzophenone groups, the structural formula of which is represented by (T-5).

That is to say, $R_1$, that is any one of a saturated or unsaturated straight or branched chain $C_1$-$C_{40}$ alkyl, $C_3$-$C_{40}$ cycloalkyl, $C_3$-$C_{40}$ heterocycloalkyl, $C_6$-$C_{40}$ aryl, and $C_6$-$C_{40}$ heteroaryl, is bonded to the photoresponsive group (benzophenone) through $L_1$ that is any one of an amide bond, ester bond and ether bond; the linking group formed by $L_1$ and $R_1$ has a role of linking multiple benzophenone photoresponsive groups. Therefore, by using a compound containing multiple benzophenone photoresponsive groups as a cross-linking agent, under ultraviolet light, benzophenone and nearby organic molecules undergo a carbon-hydrogen insertion reaction to form a covalently bonded cross-linked compound.

It will be noted that the above cross-linking agents represented by the structural formulas (T-1), (T-2), (T-3), (T-4) and (T-5) are examples based on the structure of the cross-linking agent, but not a limitation on the structure of the cross-linking agent.

In some examples, the ligand material is an organic ligand containing an alkyl carbon-hydrogen bond, and a structure of the organic ligand containing an alkyl carbon-hydrogen bond will be described below.

In some embodiments, the ligand material includes a coordination group and a carbon-hydrogen insertion group, and the ligand material is selected from any one of structures represented by the following general formula (II).

(II)

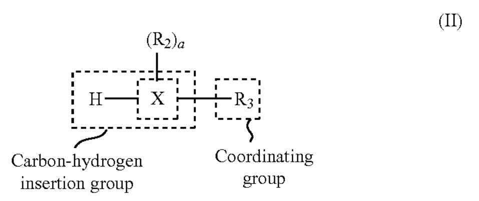

X is any one of a primary carbon group, a secondary carbon group and a tertiary carbon group, and X—H is the carbon-hydrogen insertion group. $R_2$ is selected from any one of a saturated or unsaturated straight or branched chain $C_1$-$C_{40}$ alkyl, $C_3$-$C_{40}$ cycloalkyl, $C_3$-$C_{40}$ heterocycloalkyl, $C_6$-$C_{40}$ aryl, and $C_5$-$C_{40}$ heteroaryl. $R_3$ is selected from any one of a carboxyl group (—COOH) containing a $C_1$-$C_{40}$ carbon chain, an amino group (—$NH_2$) containing a $C_1$-$C_4$a carbon chain, a mercapto group (—SH) containing a $C_1$-$C_{40}$ carbon chain, and an alkyl group containing a phosphorus atom; $R_3$ is a coordinating group, which is used for coordinately bonded to the quantum dot body. A value of a is selected from any one of 0, 1 and 2.

It will be noted that the carbon chain of $C_m$ refers to a carbon chain having m carbon (C) atoms in total, a represents the number of corresponding groups.

That is to say, the carbon atom in the carbon-hydrogen insertion group that undergoes a carbon-hydrogen insertion with the photoresponsive group benzophenone may be any of a primary carbon atom, a secondary carbon atom, and a tertiary carbon atom, and there is at least one hydrogen atom on the carbon atom.

For example, in a case where X is a primary carbon group, and the value of a is 0, the ligand material is selected from any one of structures represented by the following general formula (II-1).

(II-1)

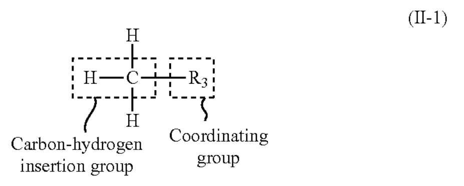

It will be noted that, for the ligand material represented by the above structural formula (II-1), three hydrogen atoms are bonded to the carbon atom of the carbon-hydrogen insertion group, and any of the three hydrogen atoms may be combined with the carbon atom to form a hydrocarbon insertion group.

For example, in a case where X is a primary carbon group, and the value of a is 1, the ligand material is selected from any one of structures represented by the following general formula (II-2).

(II-2)

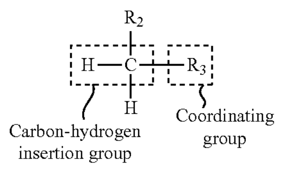

In the ligand material represented by the above structural formula (II-2), two hydrogen atoms are bonded to the carbon atom of the carbon-hydrogen insertion group, and any of the two hydrogen atoms may be combined with the carbon atom to form a hydrocarbon insertion group.

It will be noted that $R_2$ is selected from any one of a saturated or unsaturated straight or branched chain $C_1$-$C_{40}$ alkyl, $C_3$-$C_{40}$ cycloalkyl, $C_3$-$C_{40}$ heterocycloalkyl, $C_6$-$C_{40}$ aryl, and $C_6$-$C_{40}$ heteroaryl, that is to say, $R_2$ is selected from any one of alkyl, cycloalkyl, aryl and heteroaryl; the structure of $R_2$ is not specified limited here, and the structure of $R_2$ does not affect the carbon-hydrogen insertion reaction between the carbon-hydrogen insertion group CH and the photoresponsive group benzophenone.

For example, in a case where X is a secondary carbon group, and the value of a is 0, the ligand material is selected from any one of structures represented by the following general formula (II-3).

(II-3)

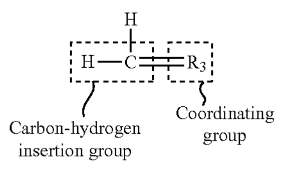

In the ligand material represented by the above structural formula (II-3), two hydrogen atoms are bonded to the carbon atom of the carbon-hydrogen insertion group, and any of the two hydrogen atoms may be combined with the carbon atom to form a hydrocarbon insertion group.

For example, in a case where X is a secondary carbon group, and the value of a is 1, the ligand material is selected from any one of structures represented by the following general formula (II-4).

(II-4)

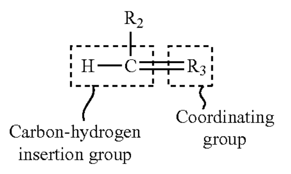

For example, in a case where X is a tertiary carbon group, and the value of a is 0, the ligand material is selected from any one of structures represented by the following general formula (II-5).

(II-5)

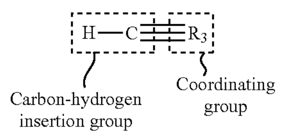

In some examples, the coordination group $R_3$ is selected from any one of a carboxyl group (—COOH) containing a $C_1$-$C_{40}$ carbon chain, an amino group (—$NH_2$) containing a $C_1$-$C_{40}$ carbon chain, a mercapto group (—SH) containing a $C_1$-$C_{40}$ carbon chain, and an alkyl group containing a phosphorus atom. The coordination group $R_3$ contains any one of a carboxyl group (—COOH), an amino group (—$NH_2$), a mercapto group (—SH) and an alkyl group containing a phosphorus atom, where the oxygen atom (O) of the carboxyl group (—COOH), the nitrogen atom (N) of the amino group (—$NH_2$), the sulfur atom (S) of the mercapto group (—SH), and the phosphorus atom (P) of the alkyl group containing a phosphorus atom may form a stable coordination bond with the quantum dot body, so as to achieve the stable connection between the ligand material and the quantum dot body. For a detail description, reference may be made to the subsequent description of the cross-linked quantum dot material, which will not be provided here.

It will be understood that, that is to say, the ligand material is selected from any one of organic acids, organic amines, organic phosphorus and organic thiols, and any one of the organic acids, organic amines, organic phosphorus and organic thiols contains an alkyl carbon-hydrogen bond (—CH).

In some examples, a structure formed after the ligand material forms a coordinate bond with the quantum dot body is any one of structures represented by the following general formula (IV).

(IV)

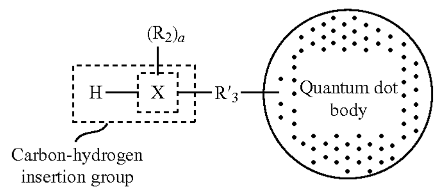

$R'_3$ is a group after the coordinating group $R_3$ is coordinated to the quantum dot body, $R_3$ is selected from any one of a carboxyl group (—COOH) containing a $C_1$-$C_{20}$ carbon chain, an amino group (—$NH_2$) containing a $C_1$-$C_2$ carbon chain, a mercapto group (—SH) containing a $C_1$-$C_{20}$ carbon chain and an alkyl group containing a phosphorus atom, and $R'_3$ is selected from any one of a structure where one hydrogen is removed from a carboxyl group (—COOH), an amino group (—$NH_2$), a mercapto group (—SH) or an alkyl group containing a phosphorus atom in $R_3$.

For example, $R_3$ is —SH, $R'_3$ is —S—; $R_3$ is —COOH, $R'_3$ is —COO—; $R_3$ is —$NH_2$, $R'_3$ is —NH—.

It will be noted that in a case where the coordination group $R_3$ is selected from alkyl groups containing a phosphorus atom, the structure of $R'_3$ is consistent with that of the coordination group $R_3$, and the lone pair of electrons on the phosphorus atom (P) may bonded to the quantum dot body by a coordination bond.

X is any one of a primary carbon group, a secondary carbon group and a tertiary carbon group, and XH is a carbon-hydrogen insertion group. $R_2$ is selected from any one of saturated or unsaturated straight or branched chain $C_1$-$C_{40}$ alkyl, $C_3$-$C_{40}$ cycloalkyl, $C_3$-$C_{40}$ heterocycloalkyl, $C_6$-$C_{40}$ aryl, and $C_6$-$C_{40}$ heteroaryl.

The structure of the cross-linked quantum dot material formed by bonding the cross-linking agent and the ligand material coordinated to the quantum dot bodies through a carbon-hydrogen insertion reaction will be introduced below.

In some examples, the cross-linked quantum dot material is selected from any one of structures represented by the following general formula (III).

(III)

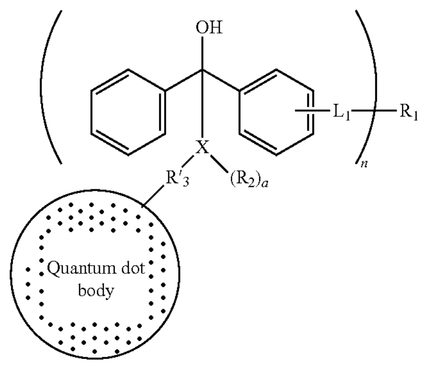

$L_1$ is selected from any one of an amide bond, ester bond and ether bond; $R_1$ is selected from any one of saturated or unsaturated straight or branched chain $C_1$-$C_{40}$ alkyl, $C_3$-$C_{40}$ cycloalkyl, $C_3$-$C_{40}$ heterocycloalkyl, $C_6$-$C_{40}$ aryl, and $C_6$-$C_{40}$ heteroaryl; a value of n is greater than or equal to 2. X is any one of a primary carbon group, a secondary carbon group and a tertiary carbon group; $R_2$ is selected from any one of a saturated or unsaturated straight or branched chain $C_1$-$C_{40}$ alkyl, $C_3$-$C_{40}$ cycloalkyl, $C_3$-$C_{40}$ heterocycloalkyl, $C_6$-$C_{40}$ aryl, and $C_6$-$C_{40}$ heteroaryl. $R'_3$ is a group formed by coordination connection between the coordinating group $R_3$ and the quantum dot body, $R_3$ is selected from any one of a carboxyl group (—COOH) containing a $C_1$-$C_{40}$ carbon chain, an amino group (—$NH_2$) containing a $C_1$-$C_4$a carbon chain, a mercapto group (—SH) containing a $C_1$-$C_4$a carbon chain and an alkyl group containing a phosphorus atom, and $R'_3$ is selected from any one of a structure where one hydrogen is removed from $R_3$ (e.g., a carboxyl group (—COOH), an amino group (—$NH_2$), a mercapto group (—SH) or an alkyl group containing a phosphorus atom); the value of a is selected from any one of 0, 1 and 2.

Figure 4:
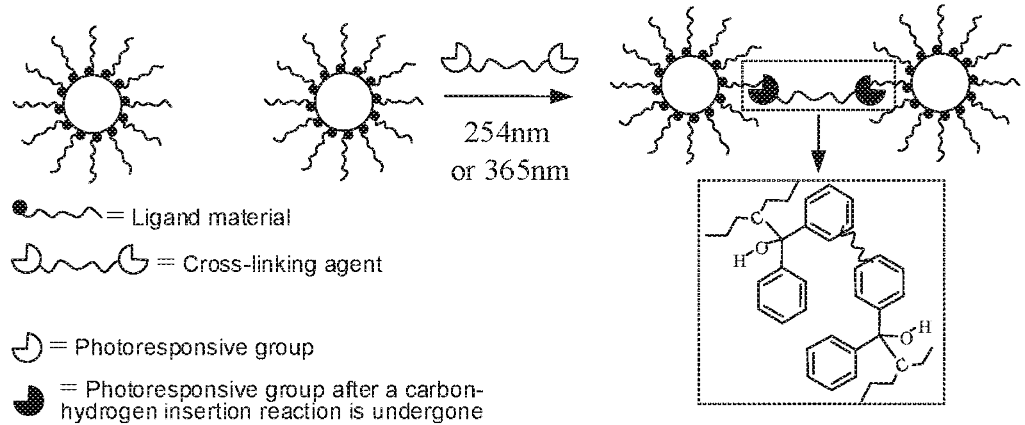
FIG. 4 is a diagram showing a photolithography patterning process involving a cross-linking agent, in accordance with some embodiments of the present disclosure.

That is to say, as shown in FIG. 4, under light illumination, such as ultraviolet light with a wavelength of 254 nm or 365 nm, benzophenone in the cross-linking agent serving as a photoresponsive group and a hydrocarbon insertion group in the ligand material undergo a carbon-hydrogen insertion reaction, and benzophenone in the cross-linking agent forms a network molecule with the ligand material on the quantum dot body in a form of a covalent bond forming by a carbon-carbon single bond; the covalent bonding is strong, and the cross-linking structure is stable.

During the carbon-hydrogen insertion reaction, a double bond of a carbonyl group in benzophenone is opened to form a triplet ketone intermediate, the carbon atom in the carbon-hydrogen insertion group attacks the carbon atom in the carbonyl group, and the hydrogen atom in the carbon-hydrogen insertion group attacks the oxygen atom in the carbonyl group to achieve the connection of the ligand material and the cross-linking agent; the ligand material and the cross-linking agent form the cross-linked ligand material, and the cross-linking agent, the ligand material and the quantum dot bodies form a cross-linked quantum dot material.

For example, in a case where the structural formula of the cross-linking agent is represented by the formula (T-1), a structural formula of the cross-linked quantum dot material is represented by the following formula (III-1).

(III-1)

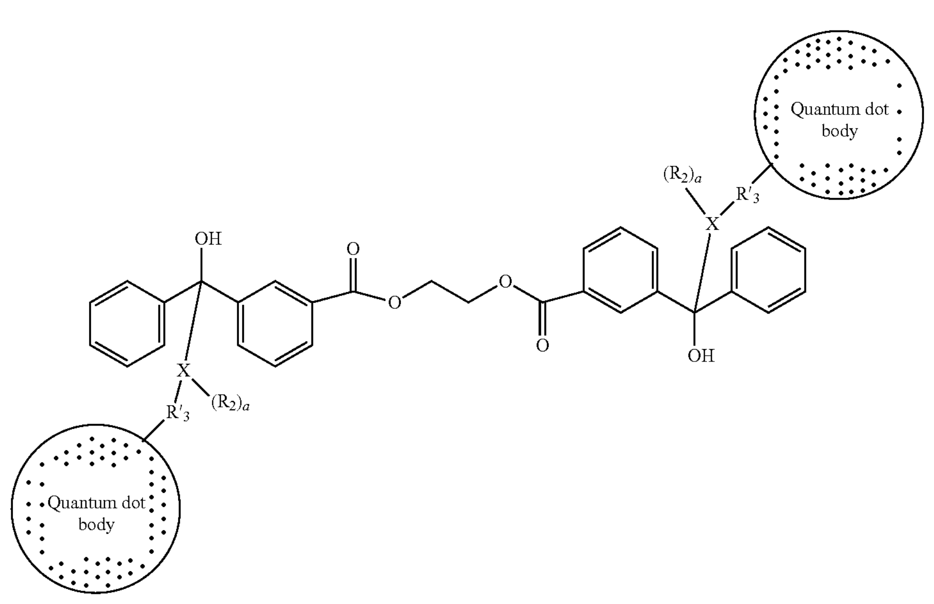

For example, in a case where the structural formula of the cross-linking agent is represented by the formula (T-2), the structural formula of the cross-linked quantum dot material is represented b the following formula (III-2).

(III-2)

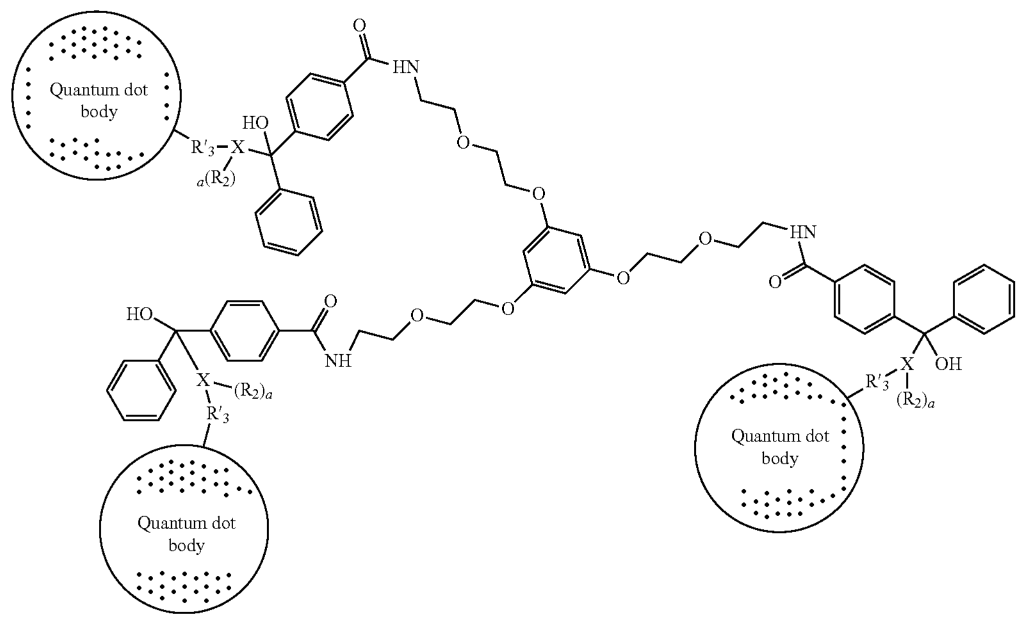

For example, in a case where the structural formula of the cross-linking agent is represented by the formula (T-5), a structural formula of the cross-linked quantum dot material is represented by the following formula (III-3).

(III-3)

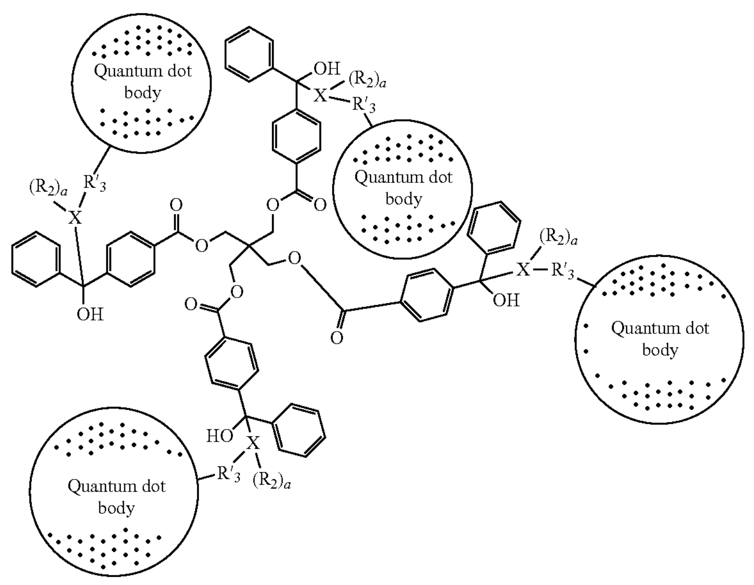

It will be noted that each quantum dot body of the cross-linked quantum dot material is bonded to multiple molecules of the ligand material, that is, each quantum dot body is bonded to multiple $R'_3$, and each molecule of the cross-linking agent is bonded to multiple quantum dot bodies. Therefore, multiple molecules of the ligand material on the quantum dot body and multiple molecules of the cross-linking agent undergo a carbon-hydrogen insertion reaction, so as to form a cross-linked quantum dot material with a network structure, and the multiple quantum dot bodies of the cross-linked quantum dot material are bonded together by a cross-linked structure. That is, under ultraviolet light, through the carbon-hydrogen insertion reaction of the cross-linking agent and the ligand material, the cross-linked ligand material and the cross-linked quantum dot material with a network structure may be formed. Compared with the solubility of the quantum dot body, the ligand material and the cross-linking agent in the solvent, the solubility of the cross-linked ligand material with a network structure and the cross-linked quantum dot material with a network structure in the solvent is greatly reduced.

The material of the quantum dot body will be introduced below.

In some embodiments, the quantum dot body includes any one of Group IIB-VIA quantum dots, Group IIIA-VA quantum dots, Group IVA-VIA quantum dots, quantum dots with a core-shell structure, and perovskite quantum dots.

For example, the quantum dot body includes Group IIB-VIA quantum dots, that is, the material of the quantum dot body is a quantum dot material formed by Group IIB and Group VIA elements. For example, the material of the quantum dot body is selected from cadmium sulfide (CdS), cadmium selenide (CdSe), cadmium telluride (CdTe), zinc sulfide (ZnS), zinc selenide (ZnSe), zinc telluride (ZnTe), mercury selenide (HgSe), mercury telluride (HgTe), mercury sulfide (HgS), $Hg_xCd_{1-x}Te$, $Hg_xCd_{1-x}S$, $Hg_xCd_{1-x}Se$, $Hg_xZn_{1-x}Te$, $Cd_xZn_{1-x}Se$, or $Cd_xZn_{1-x}S$, where $0<x<1$.

For example, the quantum dot body includes Group IIIA-VA quantum dots, that is, the material of the quantum dot body is a quantum dot material formed of Group IIIIA and Group VA elements. For example, the material of the quantum dot body is selected from indium phosphide (InP), indium arsenide (InAs), indium antimonide (InSb), gallium arsenide (GaAs), gallium phosphide (GaP), gallium nitride (GaN), gallium antimonide (GaSb), indium nitride (InN), indium antimonide (InSb), aluminium phosphide (AlP), aluminium nitride (AlN) or aluminium arsenide (AlAs).

For example, the quantum dot body includes Groups IVA-VIA quantum dots, that is, the material of the quantum dot body is a quantum dot material formed of Group IVA and Group VIA elements. For example, the material of the quantum dot body is selected from lead sulfide (PbS), lead selenide (PbSe) or lead telluride (PbTe).

For example, the quantum dot body includes quantum dots with a core-shell structure. For example, the material of the quantum dot body is selected from CdSe@ZnS, CdSe@CdS, InP@ZnS, CdTe@CdSe, CdSe@ZnTe, ZnTe@CdSe, ZnSe@ CdS or $Cd_{1-x}Zn_xS$@ZnS, where $0<x<1$. It will be noted that the material of the quantum dot body has a core-shell structure, i.e., a material of which is a core material, and another material of which is a shell material. For example, the material of quantum dot body is CdSe@ZnS, which means that the core of quantum dots is made of CdSe, and the shell of quantum dots is made of ZnS.

For example, the quantum dot body includes perovskite quantum dots, such as ABXs-type perovskite quantum dots, where A is one or more of methylamine ($CH_3NH_3^+$), formamidine ($NH_2CH{=}NH_2$), cesium ion ($Cs^+$), B is one or both of $Pb^{2+}$ and stannum ion ($Sn^{2+}$), X is one or more of $Cl^-$, Br and $I^-$, ABXs-type perovskite quantum dots include $CH_3NH_3PbBr_3$, $CH_3NH_3PbCl_3$, $CH_3NH_3PbI_3$, $CsPbBr_3$, $CsPbCl_3$ and $CsPbI_3$.

For example, the material of the quantum dot body further includes any one selected from copper indium sulfide ($CuInS_2$), copper indium selenide ($CuInSe_2$) and silver indium sulfide ($AgInS_2$).

That is to say, all quantum dot bodies whose surface is able to be coated with an organic ligand material containing an alkyl carbon-hydrogen bond are applicable.

An usage amount of the cross-linking agent will be introduced below.

In some embodiments, a mass ratio of the cross-linking agent to the quantum dot bodies is in a range of 0.005 to 0.5.

For example, the mass ratio of the cross-linking agent to the quantum dot bodies is in a range of 0.01 to 0.1; for example, the mass ratio of the cross-linking agent to the quantum dot bodies is 0.01, 0.02, 0.03, 0.04, 0.05, 0.06, 0.07, 0.08, 0.09 or 0.1.

The mass ratio of the cross-linking agent to the quantum dot bodies is in the range of 0.005 to 0.5, and the usage amount of the cross-linking agent meets the requirement of forming the cross-linked quantum dot material.

In some embodiments, the mass ratio of the cross-linking agent to the ligand material is in a range of 0.05 to 5.

For example, the mass ratio of the cross-linking agent to the ligand material is in a range of 0.1 to 1; for example, the mass ratio of the cross-linking agent to the ligand material is 0.1, 0.2, 0.3, 0.4, 0.5, 0.6, 0.7, 0.8, 0.9 or 1.

The mass ratio of the cross-linking agent to the ligand material is in the range of 0.05 to 5, and the usage amount of the cross-linking agent meets the requirement of forming the cross-linked ligand material by the cross-linking agent and the ligand material.

Figure 6:
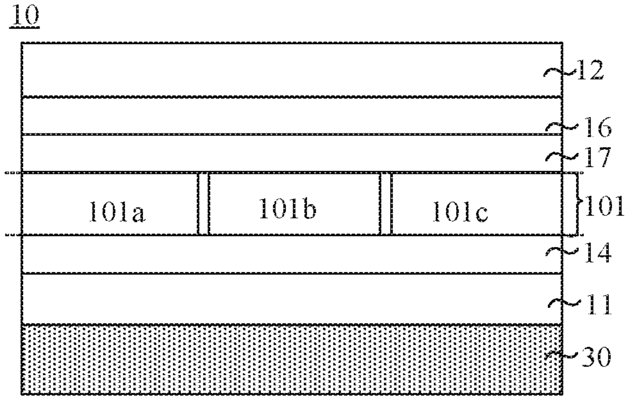
FIG. 6 is a diagram showing a structure of another light-emitting device, in accordance with some embodiments of the present disclosure.

A second aspect of the present disclosure provides a light-emitting device 10, as shown in FIGS. 5 and 6, the light-emitting device 10 includes a light-emitting layer 101, and the light-emitting layer 101 includes a cross-linked quantum dot material with a network structure that is formed by the quantum dot bodies, the ligand material and the cross-linking agent in the quantum dot material as described in any one of the above embodiments.

For the structure of the cross-linked quantum dot material, reference may be made to the content above, and will not be repeated here.

In some embodiments, as shown in FIGS. 5 and 6, the light-emitting layer 101 includes a first sub-pixel film layer 101*a*, a second sub-pixel film layer 101*b* and a third sub-pixel film layer 101*c*, and the first sub-pixel film layer 101*a*, the second sub-pixel film layer 101*b* and the third sub-pixel film layer 101*c* are sequentially arranged in a first direction X; the first direction X is perpendicular to a plane where the light-emitting layer 101 is located.

For example, the first sub-pixel film layer 101*a* is configured to emit one of red light, blue light and green light, the second sub-pixel film layer 101*b* is configured to emit another of the red light, the blue light and the green light, and the third sub-pixel film layer 101*c* is configured to emit a last one of the red light, the blue light and the green light.

For example, the first sub-pixel film layer 101*a* is configured to emit the red light, the second sub-pixel film layer 101*b* is configured to emit the blue light, and the third sub-pixel film layer 101*c* is configured to emit the green light.

In some embodiments, as shown in FIGS. 5 and 6, the light-emitting device further includes a first electrode 11 and a second electrode 12, and the light-emitting layer 101 is disposed between the first electrode 11 and the second electrode 12.

For example, the first electrode 11 is one of a cathode and an anode, and the second electrode 233 is the other of a cathode and an anode.

In some embodiments, as shown in FIG. 6, the light-emitting device 10 further includes an electron transporting layer 14, and the electron transporting layer 14 is disposed between the first electrode 11 and the light-emitting layer 101. The light-emitting device 10 further includes a hole injection layer 16 and a hole transporting layer 17; the hole injection layer 16 and the hole transporting layer 17 are stacked between the second electrode 12 and the light-emitting layer 101, and the hole injection layer 16 and the hole transporting layer 17 are sequentially arranged in a direction far away from the second electrode 12.

That is to say, the first electrode 11 is a cathode, and the electron transport layer 14 is disposed between the cathode and the light-emitting layer 101. The provision of the electron transporting layer 14 may improve the electron transport efficiency. The second electrode 12 is an anode, and the anode, the hole injection layer 16, the hole transporting layer 17 and the light-emitting layer 101 are arranged in sequence. The provision of the hole injection layer 16 and the hole transporting layer 17 may improve the hole transport efficiency.

A method of manufacturing a light-emitting device will be described below.

Figure 7:
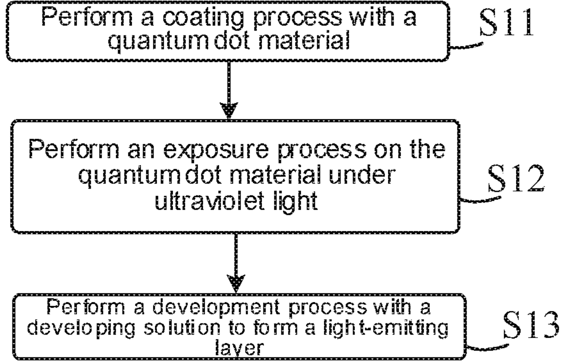
FIG. 7 is a flow diagram of a method of manufacturing a light-emitting layer of a light-emitting device, in accordance with some embodiments of the present disclosure.

In some embodiments, as shown in FIG. 7, the method of manufacturing the light-emitting device includes forming a light-emitting layer 101, and a step of forming the light-emitting layer 101 includes S11 to S13.

In S11, a coating process is performed with a quantum dot material.

The quantum dot material includes the quantum dot material provided by any of the above embodiments; the quantum dot material includes quantum dot bodies, a ligand material and a cross-linking agent, and the ligand material is coordinated to the quantum dot bodies.

Figure 8:
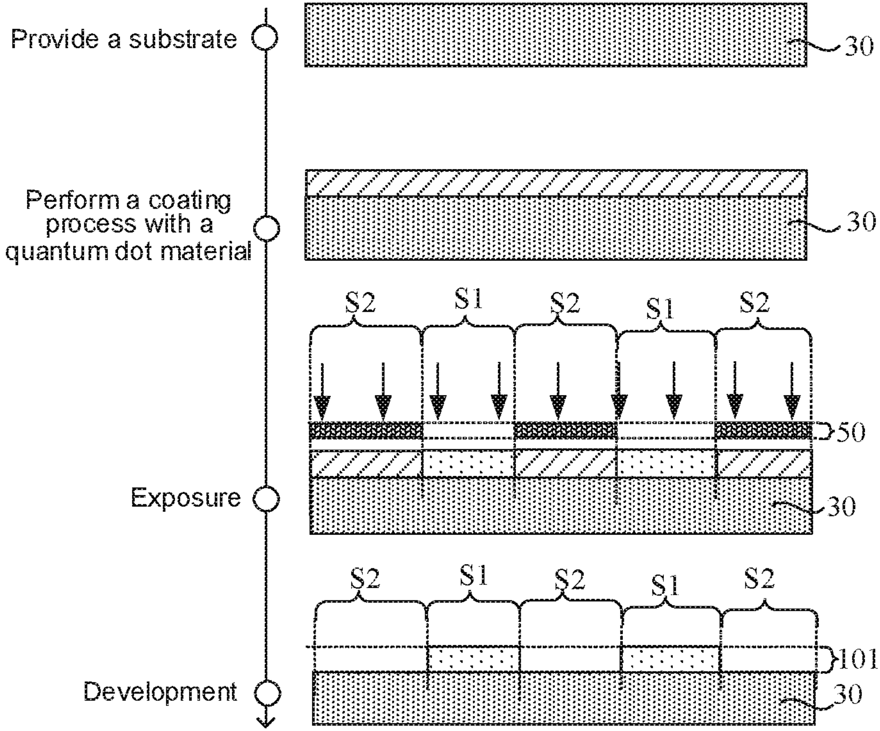
FIG. 8 is a diagram showing steps of a method of manufacturing a light-emitting layer of a light-emitting device, in accordance with some embodiments of the present disclosure.

For example, as shown in FIG. 8, a substrate 30 is coated with the quantum dot material; the substrate 30 is selected from any one of a glass substrate and a silicon wafer, and there may be other film layers provided between the substrate 30 and the quantum dot material, which is not limited here.

In S12, an exposure process is performed on the quantum dot material under ultraviolet light.

For example, as shown in FIG. 8, the quantum dot material is exposed, with a mask 50, under the ultraviolet light at a wavelength of 254 nm or 365 nm. In an exposure region S1, the cross-linking agent and the ligand material in the quantum dot material are bonded through a carbon-hydrogen insertion reaction to form a cross-linked ligand material. A solubility of the cross-linked ligand material in a solvent is less than a solubility of the ligand material and the cross-linking agent in the solvent.

In S13, a development process is performed with a developing solution to form the light-emitting layer 101.

For example, as shown in FIG. 8, the exposed quantum dot material is immersed in a developing solution (e.g., a toluene solution) for development, and the quantum dot material in the exposure region S1 forms a cross-linked quantum dot material under ultraviolet light; the cross-linked quantum dot material has a low solubility in the developing solution, and is remained after being performed thereon a development process in the developing solution. The quantum dot material in a non-exposed region S2 does not form a cross-linked network structure, so that it is eluted in the developing solution and removed. Thus, a light-emitting layer pattern corresponding to the mask is formed, so as to form the light-emitting layer 101.

Figure 9:
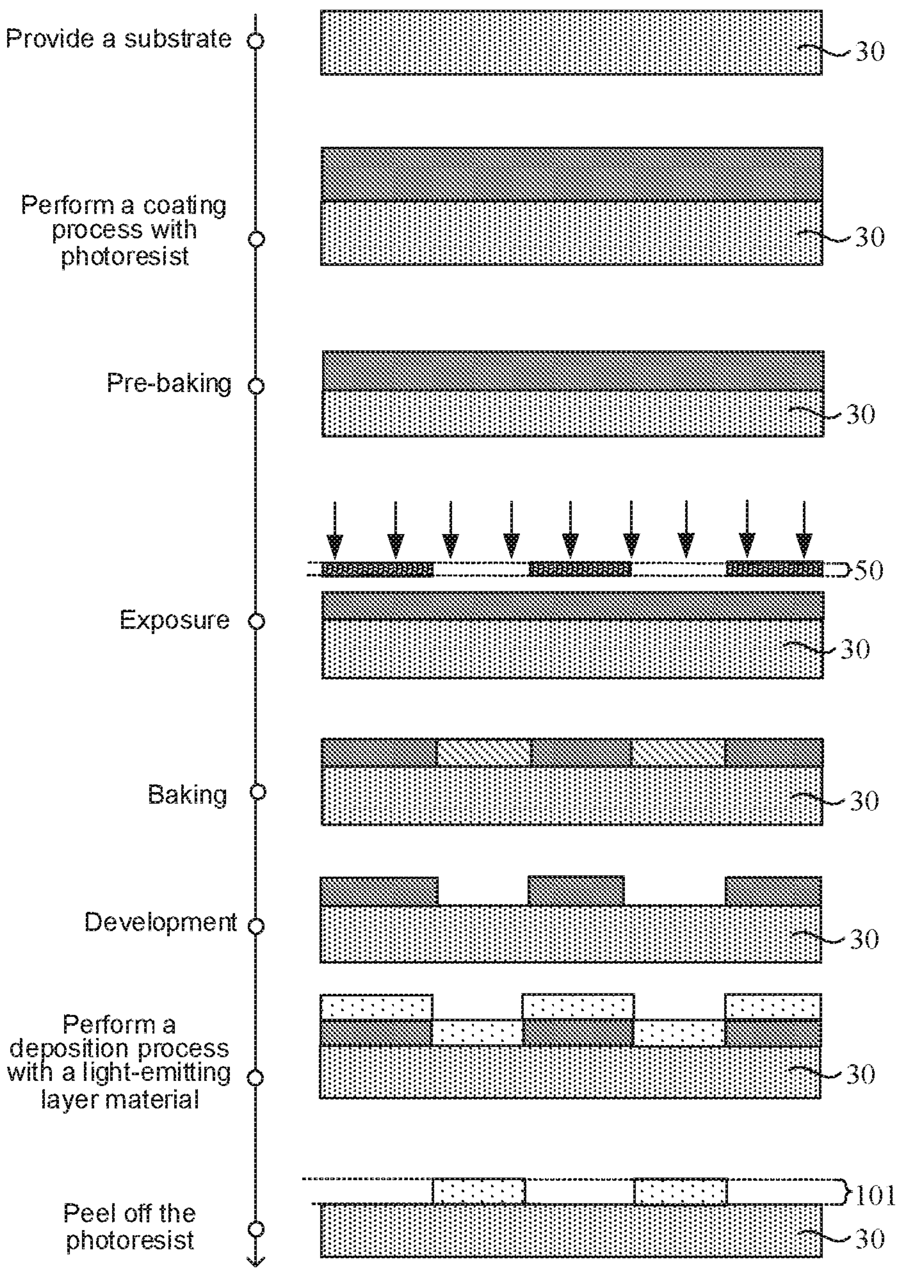
FIG. 9 is a diagram showing steps of a method of manufacturing a light-emitting layer of a light-emitting device, in accordance with some embodiments of the present disclosure.

In the related art, as shown in FIG. 9, steps of forming the light-emitting layer 101 include: providing the substrate 30, performing a coating process with photoresist, performing a pre-baking process, performing an exposure process, performing a baking process, performing a development process, performing a deposition process with a light-emitting layer material, and peeling off the photoresist. In this method, a photoresist layer is used as a sacrificial layer, and the photoresist layer needs to be washed off to remove unnecessary the light-emitting layer material, so that the processing steps are complicated. If the light-emitting layer 101 includes a first sub-pixel film layer 101*a*, a second sub-pixel film layer 101*b*, and a third sub-pixel film layer 101*c* that are shown in FIGS. 5 and 6, there is a need to repeat following steps: performing a coating process with photoresist, performing a pre-baking process, performing an exposure process, performing a baking process, performing a development process, performing a deposition process with a light-emitting layer material, and peeling off the photoresist, so as to form one of the sub-pixel film layers (e.g., the second sub-pixel film layer 101*b* or the third sub-pixel film layer 101*c*).

Therefore, if sub-pixel film layers of three colors of red, green and blue are need to be constructed, according to the steps of forming the light-emitting layer 101 in the related art, there is a need to repeat following steps three times: performing a coating process with photoresist, performing a pre-baking process, performing an exposure process, performing a baking process, performing a development process, performing a deposition process with a light-emitting layer material, and peeling off the photoresist, so that 21 processing steps are required in total.

Figure 10:
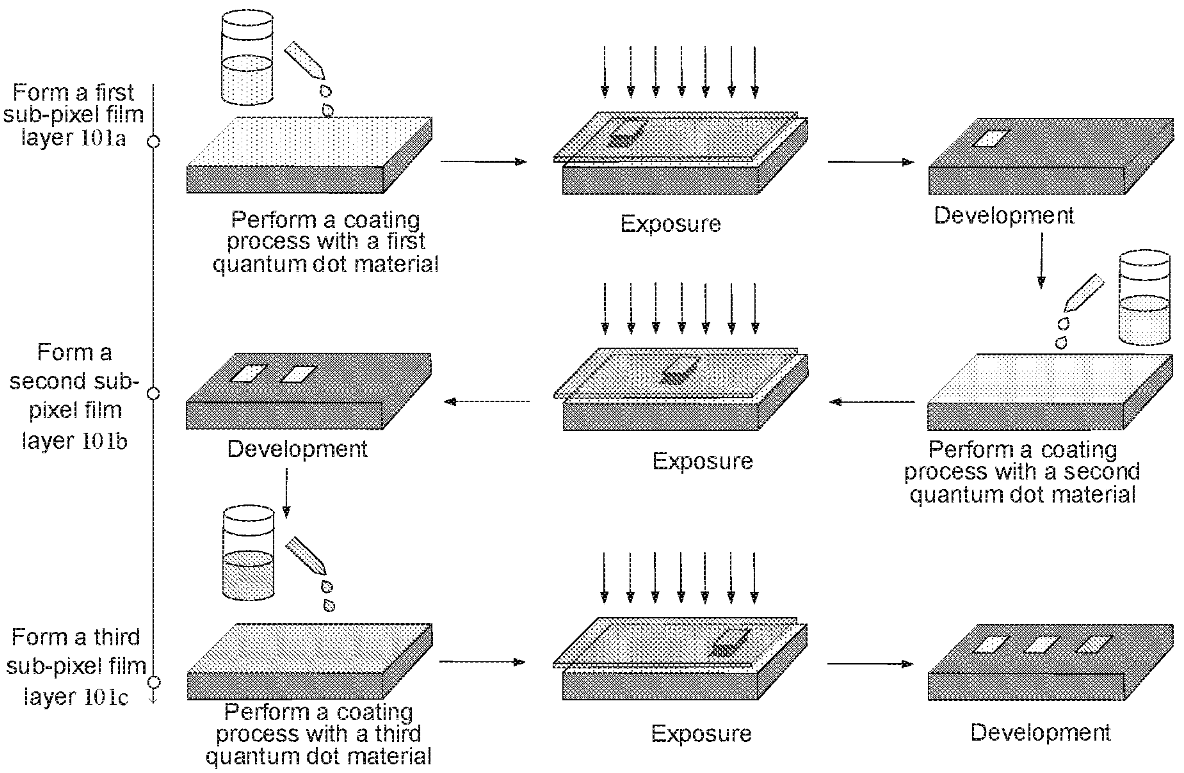
FIG. 10 is a diagram showing steps of a method of manufacturing a light-emitting layer of a light-emitting device, in accordance with some embodiments of the present disclosure.

However, by adopting a method of forming the light-emitting layer 101 by using the material of the light-emitting layer provided in the embodiments of the present disclosure, only 9 processing steps are required to form the first sub-pixel film layer 101*a*, the second sub-pixel film layer 101*b* and the third sub-pixel film layer 101*c*. For example, the first sub-pixel film layer 101*a* is configured to emit red light, the second sub-pixel film layer 101*b* is configured to emit blue light, and the third sub-pixel film layer 101*c* is configured to emit green light. It will be noted that, as shown in FIG. 10, a material for forming the first sub-pixel film layer 101*a* is represented as a first quantum dot material, a material for forming the second sub-pixel film layer 101*b* is represented as a second quantum dot material, and a material for forming the third sub-pixel film layer 101*c* is represented as a third quantum dot material. The first quantum dot material, the second quantum dot material and the third quantum dot material each contain quantum dot bodies that emit light of a different color.

Figure 11:
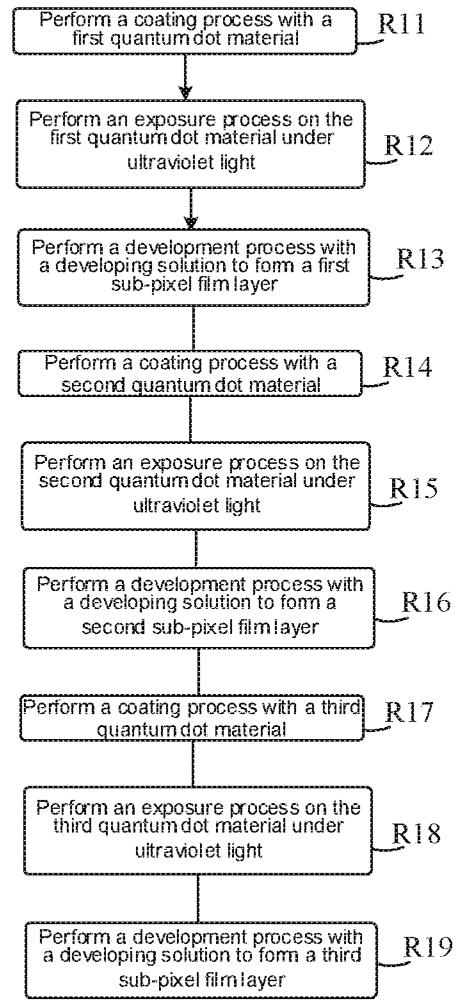
FIG. 11 is a flow diagram of another method of manufacturing a light-emitting layer of a light-emitting device, in accordance with some embodiments of the present disclosure.

For example, specific steps of the 9 processing steps for forming sub-pixel film layers of three colors of red, green and blue are shown in FIGS. 10 and 11, which include steps R11 to R19.

In R11, a coating process is performed with the first quantum dot material.

In R12, an exposure process is performed on the first quantum dot material under ultraviolet light.

In R13, a development process is performed with a developing solution to form the first sub-pixel film layer 101*a*.

In R14, a coating process is performed with the second quantum dot material.

In R15, an exposure process is performed on the second quantum dot material under ultraviolet light.

In R16, a development process is performed with a developing solution to form the second sub-pixel film layer 101*b*.

In R17, a coating process is performed with the third quantum dot material.

In R18, an exposure process is performed on the third quantum dot material under ultraviolet light.

In R19, a development process is performed with a developing solution to form the third sub-pixel film layer 101*c* to obtain the light-emitting layer 101.

It will be noted that, as for the steps R11 to R19, reference is made to the introduction of the steps S11 to S13, which will not be repeated here.

The benzophenone derivative cross-linking agent has a good solvent compatibility with the quantum dot solution, and a spin coating process, an exposure process and a development process may be performed directly, which is possible to avoid the step of removing the photoresist sacrificial layer in the traditional photolithography method, so that the method is simple and reliable. As for the construction of multi-layer patterned film layers, only the steps of performing a spin coating process, performing an exposure process and performing a development process need to be repeated, which is easy to construct multi-layer patterned devices with full color of red, green and blue.

Therefore, from the perspective of surface chemistry of quantum dots, in the present disclosure a cross-linking agent containing benzophenone groups is introduced to achieve the direct patterning of quantum dots without photoresist. The method is simple and efficient, and shortens the processing flow of the quantum dot film layer.

Based on the above description of forming the light-emitting layer 101 of the light-emitting device 10, the following embodiments will be provided.

Embodiment 1

Considering the cross-linking agent, i.e., ethane-1,2-diyl bis(3-benzoylbenzoate), represented by the structural formula (T-1) as an example, the method of manufacturing the light-emitting layer 101 will be described below.

That is, the red CdSe/ZnSe/ZnS quantum dot body with oleic acid as the ligand material on the surface thereof, the green CdSe/CdZnSeS/ZnS quantum dot body with octanethiol as the ligand material on the surface thereof, and the blue CdZnSe/CdZnS/ZnS quantum dot body with oleic acid as the ligand material on the surface thereof are considered as model representative quantum dot bodies with a concentration of 20 mg/mL, the solvent is toluene, the cross-linking agent is ethane-1,2-diyl bis(3-benzoylbenzoate) with a concentration of 1 mg/mL. The process of verification experiments of patterning of the cross-linking agent molecules, i.e., ethane-1,2-diyl bis(3-benzoylbenzoate) is as follows.

A toluene mixed solution of the quantum dot bodies (20 mg/mL) and ethane-1,2-diyl bis(3-benzoylbenzoate) (1 mg/mL) is shaked well, and is filtered with a 0.22 μm polytetrafluoroethylene organic filter membrane to remove dust or particle; then, a silicon wafer is spin coated with the solution (a spin-coating speed is 2000 rpm, and a spin-coating time is 30 s). Next, the silicon wafer is placed under a mask to expose for 30 s with a 3.3 $mW/cm^2$ ultraviolet lamp at 254 nm (a total dose is 100 $mJ/cm^2$). Then, the silicon wafer is immersed in a toluene solution to elute and develop, and drying, so that the patterned quantum dot film layer on the silicon wafer may be obtained.

Comparative Example 1: a quantum dot solution without cross-linking agent molecules is considered as a blank control group, and a filtration process, a spin coating process, an exposure process and a development process that are the same as Embodiment 1 are performed.

Comparing the photoluminescence photos of the patterning results under ultraviolet light of Embodiment 1 and Comparative Example 1, it can be seen that the quantum dots cannot be patterned when ethane-1,2-diyl bis(3-benzoylbenzoate) is not added, and quantum dot patterns with different luminescent colors are obtained after ethane-1,2-diyl bis(3-benzoylbenzoate) is added and performed an exposure process and a development process.

Therefore, comparing Embodiment 1 and Comparative Example 1, it is directly verified that ethane-1,2-diyl bis(3-benzoylbenzoate) serving as a cross-linking agent may achieve the photolithographic patterning effect of quantum dots. Moreover, it is also verified, through this embodiment, that, as for the quantum dot bodies with different ligand materials on the surface thereof, such as the red quantum dot body with oleic acid on the surface thereof and the green quantum dot body with octanethiol on the surface thereof, ethane-1,2-diyl bis(3-benzoylbenzoate) may achieve the photolithographic patterning, which proves that the method has general applicability for materials.

Embodiment 2

A glass substrate is used as a substrate for the direct patterning method to verify whether the material of the substrate has any effect on the direct patterning method in a case where ethane-1,2-diyl bis(3-benzoylbenzoate) serves as the cross-linking agent.

The quantum dot body is red CdSe/ZnSe/ZnS quantum dot body with oleic acid as the ligand material on the surface thereof with a concentration of 20 mg/mL, the solvent is toluene, the cross-linking agent is ethane-1,2-diyl bis(3-benzoylbenzoate) with a concentration of 1 mg/mL, the pattering verification experiment of the cross-linking agent ethane-1,2-diyl bis(3-benzoylbenzoate) is carried out on the glass substrate, the process is as follows.

A toluene mixed solution of the quantum dot bodies (20 mg/mL) and ethane-1,2-diyl bis(3-benzoylbenzoate) (1 mg/mL) is shook well, and is filtered with a 0.22 μm polytetrafluoroethylene organic filter membrane, and then, the glass substrate is spin coated with the solution (a spin-coating speed is 2000 rpm, and a spin-coating time is 30 s). Next, the glass substrate is placed under a mask to expose for 30 s with a 3.3 $mW/cm^2$ ultraviolet lamp at 254 nm (a total dose is 100 $mJ/cm^2$). Then, the glass substrate is immersed in a toluene solution to elute and develop, and drying, so that the patterned quantum dot film layer on the glass substrate may be obtained.

In Embodiment 1, a silicon wafer is adopted as the substrate, and in Embodiment 2, a glass substrate is adopted as the substrate. It can be seen from the combination of Embodiment 1 and Embodiment 2 that ethane-1,2-diyl bis (3-benzoylbenzoate) may achieve the photolithography of the light-emitting layer 101 for different substrates, so that it proves that patterning may be directly performed on different substrates to form the light-emitting layer 101.

Embodiment 3

Figure 12:
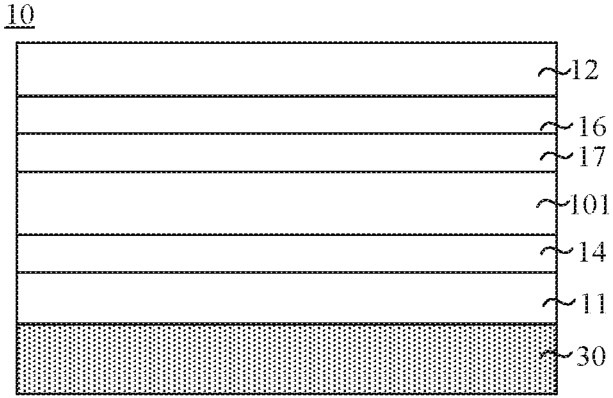
FIG. 12 is a diagram showing a structure of yet another light-emitting device, in accordance with some embodiments of the present disclosure.
Figure 13:
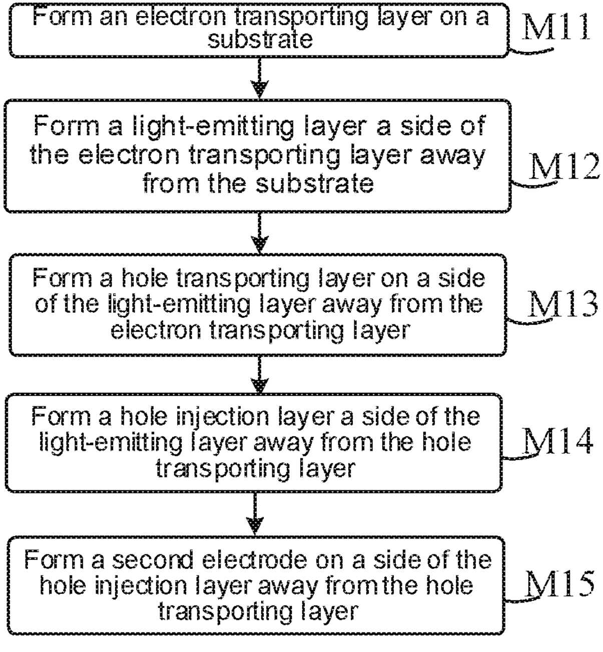
FIG. 13 is a flow diagram of a method of manufacturing a light-emitting device, in accordance with some embodiments of the present disclosure.

The quantum dot material provided by the embodiments of the present disclosure is used to form an inverted bottom emission light-emitting device 10, as shown in FIG. 12, a method of manufacturing the light-emitting device 10, as shown in FIG. 13, includes steps M11 to M15.

In M11, an electron transporting layer 14 is formed on a substrate 30.

For example, an ITO substrate 30 (ITO means indium tin oxide layer, and an indium tin oxide layer is used as a first electrode 11) is spin coated with zinc oxide nanoparticles by a sol-gel method in which a spin-coating speed is 2000 rpm and a spin-coating time is 30 s; a concentration of the zinc oxide nanoparticles is 75 mg/mL; and then, annealing is performed at 180° C. for 1 minute to form the electron transporting layer 14.

In M12, a light-emitting layer 101 is formed on a side of the electron transporting layer 14 away from the substrate 30.

The electron transporting layer 14 is spin coated with the quantum dot solution (20 mg/mL) and the ligand material and the toluene solution of ethane-1,2-diyl bis(3-benzoylbenzoate) (1 mg/mL) (the spin-coating speed is 2000 rpm, and the spin coating time is 30 s). After completion, vacuum for 3 minutes to remove the toluene solvent, then place it under the mask to expose for 30 s with a 3.3 $mW/cm^2$ ultraviolet lamp at 254 nm (a total dose is 100 $mJ/cm^2$). Then, immersing in the toluene solution to elute and develop, and vacuum to dry, so that the patterned quantum dot film layer is obtained.

For example, the above-mentioned quantum dot bodies and the ligand material may be the red CdSe/ZnSe/ZnS quantum dot body with oleic acid as the ligand material on the surface thereof, the green CdSe/CdZnSeS/ZnS quantum dot body with octanethiol as the ligand material on the surface thereof, and the blue CdZnSe/CdZnS/ZnS quantum dot body with oleic acid as the ligand material on the surface thereof.

In M13, a hole transporting layer 17 is formed on a side of the light-emitting layer 101 away from the electron transporting layer 14.

For example, annealing is performed at 120° C. for 10 minutes in a glove box, and the hole transporting layer 17 is formed by evaporation.

For example, the material of the hole transporting layer 17 includes poly[(9,9-dioctylfluorenyl-2,7-diyl)-co-(4,4'-(N-(4-sec-butylphenyl) diphenylamine)] (TFB), or polyvinylcarbazole (PVK), which is not limited here.

In M14, a hole injection layer 16 is formed on a side of the light-emitting layer 17 away from the hole transporting layer 17.

For example, the hole injection layer 16 is formed by evaporation.

For example, the material of the hole injection layer 16 includes poly-3,4-ethylenedioxythiophene, polystyrene sulfonate or other compounds suitable for the hole injection layer, which is not limited here.

In M15, the second electrode 12 is formed on a side of the hole injection layer 16 away from the hole transporting layer 17.

For example, the manufacturing of the light-emitting device 10 as shown in FIG. 12 is completed after encapsulation.

For example, the second electrode 12 is formed by evaporation, and a thickness of the second electrode 12 is 120 nm.

For example, the second electrode 12 is made of silver.

It will be noted that, as shown in FIG. 12, a structure in which a cathode (a first electrode 11), an electron transporting layer 11, a light-emitting layer 101, a hole transporting layer 17, a hole injection layer 16 and an anode (a second electrode 12) are arranged on the substrate 30 in sequence is an inverted light-emitting device 10. Furthermore, the first electrode 11 is set as a transparent electrode, the second electrode 12 is set as a reflective electrode, and the light-emitting device 10 is an inverted bottom emission light-emitting device 10.

Embodiment 4

Figure 14:
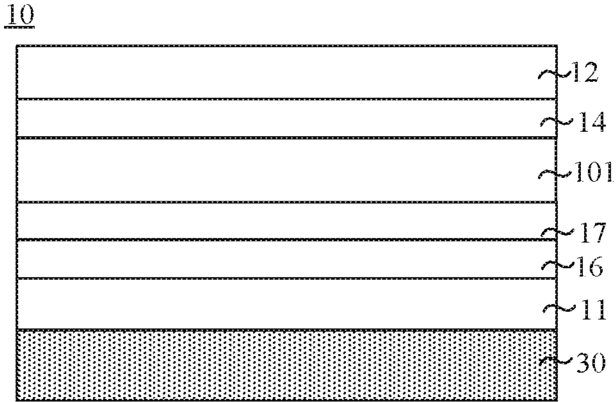
FIG. 14 is a diagram showing a structure of yet another light-emitting device, in accordance with some embodiments of the present disclosure.
Figure 15:
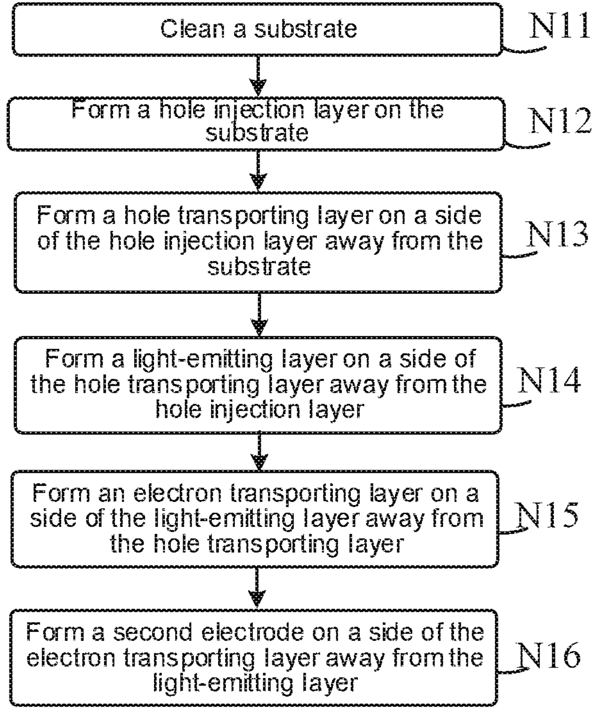
FIG. 15 is a flow diagram of yet another method of manufacturing a light-emitting device, in accordance with some embodiments of the present disclosure.

The quantum dot material provided by the embodiments of the present disclosure is used to form an upright bottom emission light-emitting device 10; a structure of the light-emitting device 10 is as shown in FIG. 14, and a method of manufacturing the light-emitting device 10, as shown in FIG. 15, includes steps N11 to N16.

In N11, a substrate 30 is cleaned.

For example, the substrate 30 adopts an ITO substrate, and ITO represents an indium tin oxide layer; the indium tin oxide layer is used as a first electrode 11, and the first electrode 11 is an anode.

For example, the ITO substrate is cleaned with deionized water and isopropanol, and then treated under a plasma cleaner (ultraviolet plus ozone) for 15 minutes.

In N12, a hole injection layer 16 is formed on the substrate 30.

For example, the hole injection layer 16 is made of PEDOT:PSS, and PEDOT:PSS is poly 3,4-ethylenedioxythiophene/polystyrene sulfonate.

For example, a spin coating process is performed with PEDOT:PSS in an air atmosphere, the spin-coating speed being 500 rpm, the spin-coating time being 60 s, and baked at 120° C. for 10 minutes to remove the water solvent to form the hole injection layer 16.

In N13, a hole transporting layer 17 is formed on a side of the hole injection layer 16 away from the substrate 30.

For example, a spin coating process is performed with cross-linked TFB chlorobenzene solution for a thickness of 30 nm under the nitrogen atmosphere of a glove box; TFB is poly[(9,9-dioctylfluorenyl-2,7-diyl)-co-(4,4'-(N-(4-sec-butylphenyl) diphenylamine)], and the concentration of TFB is 8 mg/mL; the spin-coating speed is 3000 rpm, and the spin-coating time is 30 s; annealing is performed at 150° C. for 30 minutes to form the hole transporting layer 17.

In N14, a light-emitting layer 101 is formed on a side of the hole transporting layer 17 away from the hole injection layer 16.

For example, a spin coating process is performed with the quantum dot bodies (20 mg/mL) and the ligand material and a toluene solution of ethane-1,2-diyl bis(3-benzoylbenzoate) (1 mg/mL), the spin-coating speed being 2000 rpm, and the spin coating time being 30 s. After completion, vacuum for 3 minutes to remove the toluene solvent, then place it under a mask to expose for 30 s with a 3.3 $mW/cm^2$ ultraviolet lamp at 254 nm (a total dose is 100 $mJ/cm^2$), and then immersing in the toluene solution to elute and develop, and vacuum to dry, so that a patterned quantum dot film layer may be obtained.

For example, the above-mentioned quantum dot bodies and the ligand material may be the red CdSe/ZnSe/ZnS quantum dot body with oleic acid as the ligand material on the surface thereof, the green CdSe/CdZnSeS/ZnS quantum dot body with octanethiol as the ligand material on the surface thereof, and the blue CdZnSe/CdZnS/ZnS quantum dot body with oleic acid as the ligand material on the surface thereof.

In N15, an electron transporting layer 14 is formed on a side of the light-emitting layer 101 away from the hole transporting layer 17.

For example, the electron transporting layer 14 may be made of zinc oxide nanoparticles.

For example, a spin coating process is performed with an ethanol solution of the zinc oxide nanoparticles in a glove box, a concentration of the zinc oxide nanoparticles is 30 mg/mL, a spin-coating speed is 3000 rpm, and a spin-coating time is 30 s; and then, baking at 120° C. for 10 minutes to remove the solvent to form the electron transporting layer 14.

In N16, a second electrode 12 is formed on a side of the electron transporting layer 14 away from the light-emitting layer 101.

For example, the second electrode 12 is a cathode, and the second electrode 12 is made of aluminum.

For example, the second electrode 12 is formed by evaporation, and a thickness of the second electrode 12 is 120 nm.

Next, dispensing to encapsulate, and the manufacturing of the light-emitting device 10 as shown in FIG. 14 is completed.

It will be noted that, as shown in FIG. 14, a structure in which the anode (the first electrode 11), the hole injection layer 16, the hole transporting layer 17, the light-emitting layer 101, the electron transporting layer 11 and the cathode (the second electrode 12) are sequentially arranged on the substrate 30 is an upright light-emitting device 10. Furthermore, the first electrode 11 is set as a transparent electrode, and the second electrode 12 is set as a reflective electrode, so that the light-emitting device 10 is an upright bottom emission light-emitting device 10.

It can be seen from Embodiment 3 and Embodiment 4 that the quantum dot material provided by the embodiments of the present disclosure can be used in manufacturing of the upright light-emitting device 10 and the inverted light-emitting device 10.

Embodiment 5

Figure 16:
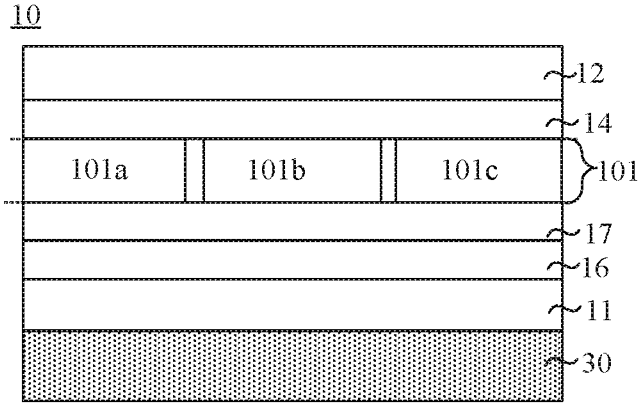
FIG. 16 is a diagram showing a structure of yet another light-emitting device, in accordance with some embodiments of the present disclosure.

The quantum dot material provided by the embodiments of the present disclosure is used to form a quantum dot light-emitting device 10 having three sub-pixel film layers of red, green and blue, and a structure of which is shown in FIG. 16. As for the method of manufacturing the light-emitting device, reference may be made to the steps N11 to N16. For the step of forming the light-emitting layer 101 on the side of the hole transporting layer 17 away from the hole injection layer 16 (N14), reference may be made to steps R11 to R19.

In N11, a substrate 30 is cleaned.

In N12, a hole injection layer 16 is formed on the substrate 30.

In N13, a hole transporting layer 17 is formed on a side of the hole injection layer 16 away from the substrate 30.

In N14, a light-emitting layer 101 is formed on a side of the hole transporting layer 17 away from the hole injection layer 16. This step includes R11 to R19.

In R11, a coating process is performed with a first quantum dot material.

For example, the first quantum dot material is red quantum dots, and a spin coating process is performed with the red quantum dots (20 mg/mL) and a toluene solution of ethane-1,2-diyl bis(3-benzoylbenzoate) (1 mg/mL) at 3000 rpm for 30 s; after completion, vacuum for 3 minutes to remove the toluene solvent.

In R12, an exposure process is performed on the first quantum dot material under ultraviolet light.

For example, the first quantum dot material after the spin coating process is completed is placed under a mask to expose for 30 s with a 3.3 $mW/cm^2$ ultraviolet lamp at 365 nm (a total dose is 100 $mJ/cm^2$).

In R13, a development process is performed with a developing solution to form the first sub-pixel film layer 101*a*.

For example, the first quantum dot material after the exposure process is completed is immersed in a toluene solution for elution and development; and then, vacuum to dry, so that a patterned red quantum dot film layer is obtained.

In R14, a coating process is performed with a second quantum dot material.

For example, the second quantum dot material is green quantum dots; a spin coating process is performed with green quantum dots (20 mg/mL) and a toluene solution of ethane-1,2-diyl bis(3-benzoylbenzoate) (1 mg/mL) at 3000 rpm for 30 s; after completion, vacuum for 3 minutes to remove the toluene solvent.

In R15, an exposure process is performed on the second quantum dot material under ultraviolet light.

For example, the second quantum dot material after the spin coating process is completed is placed under a mask to expose for 30 s with a 3.3 $mW/cm^2$ ultraviolet lamp at 365 nm (a total dose is 100 $mJ/cm^2$).

In R16, a development process is performed with a developing solution to form the second sub-pixel film layer 101*b*.

For example, the second quantum dot material after the exposure process is completed is immersed in a toluene solution for elution and development; and then, vacuum to dry, so that patterned red and green quantum dot film layers are obtained.

In R17, a coating process is performed with a third quantum dot material.

For example, the third quantum dot material is blue quantum dots, and a spin coating process is performed with the blue quantum dots (20 mg/mL) and a toluene solution of ethane-1,2-diyl bis(3-benzoylbenzoate) (1 mg/mL) at 3000 rpm for 30 s; after completion, vacuum for 3 minutes to remove the toluene solvent.

In R18, an exposure process is performed on the third quantum dot material under ultraviolet light.

For example, the third quantum dot material after the spin coating process is completed is placed under a mask to expose for 30 s with a 3.3 $mW/cm^2$ ultraviolet lamp at 365 nm (a total dose is 100 $mJ/cm^2$).

In R19, a development process is performed with a developing solution to form a third sub-pixel film layer 101*c* to obtain a light-emitting layer 101.

For example, the third quantum dot material after the exposure process is completed is immersed in a toluene solution for elution and development; and then, vacuum to dry, so that patterned red, green and blue quantum dot film layers are obtained.

In N15, an electron transporting layer is formed on a side of the light-emitting layer 101 away from the hole transporting layer 17.

In N16, a second electrode 12 is formed on the electron transporting layer 14 away from the light-emitting layer 101.

Next, dispensing to encapsulate, and the manufacturing of the light-emitting device 10 as shown in FIG. 16 is completed.

In some examples, the quantum dot material of the embodiments of the present disclosure is used in the manufacturing of a patterned quantum dot film layer, and further used in optoelectronic devices such as quantum dot light-emitting diodes and photodetectors.

Figure 17:
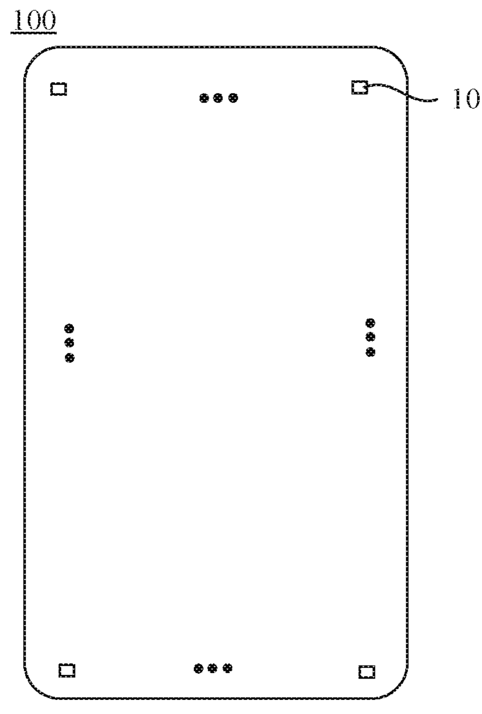
FIG. 17 is a diagram showing a structure of a display substrate, in accordance with some embodiments of the present disclosure.

Some embodiments of the present disclosure provide a display substrate 100, as shown in FIG. 17, the display substrate 100 includes the light-emitting device 10 provided in any of the above embodiments.

The beneficial effects that can be achieved by the display substrate 100 are the same as the beneficial effects of the light-emitting device 10 provided in the present disclosure, and details will not be repeated here.

Figure 18:
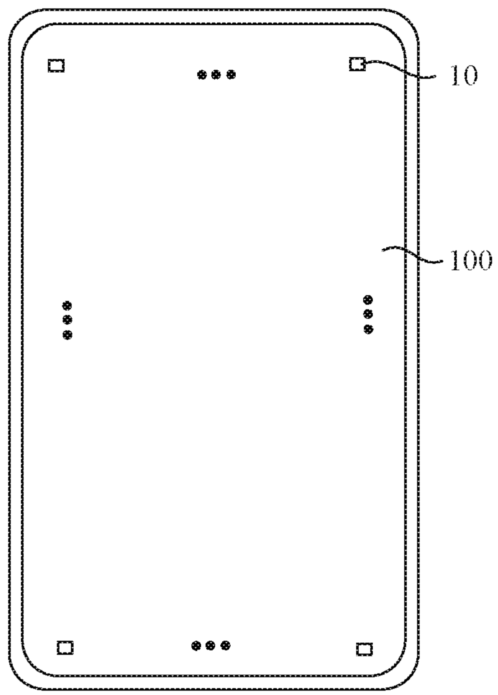
FIG. 18 is a diagram showing a structure of a display device, in accordance with some embodiments of the present disclosure.

Some embodiments of the present disclosure provide a display apparatus 1000, as shown in FIG. 18, the display apparatus 1000 includes the display substrate 100 provided in the above embodiments.

The display apparatus 1000 provided in the embodiments of the present disclosure may be any apparatus that displays images whether in motion (e.g., a video) or stationary (e.g., a static image), and whether textual or graphical. More specifically, it is expected that the embodiments may be implemented in or associated with a plurality of electronic devices. The plurality of electronic devices may include (but is not limit to), for example, mobile telephones, wireless devices, personal data assistants (PAD), hand-held or portable computers, GPS receivers/navigators, cameras, MP4 video players, video cameras, game consoles, watches, clocks, calculators, TV monitors, flat panel displays, computer monitors, car displays (such as odometer displays), navigators, cockpit controllers and/or displays, camera view displays (such as rear view camera displays in vehicles), electronic photos, electronic billboards or indicators, projectors, building structures, packagings and aesthetic structures (such as a display for an image of a piece of jewelry), etc.

The beneficial effects of the display apparatus 1000 are the same as the beneficial effects of the light-emitting device 10 provided in the present disclosure, and details will not be repeated here.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A quantum dot material, comprising:

quantum dot bodies and a ligand material coordinated to the quantum dot bodies; and a cross-linking agent, the cross-linking agent including at least two photoresponsive groups and a linking group bonding the at least two photoresponsive groups;

wherein each photoresponsive group in the at least two photoresponsive groups is bonded, under light illumination, to the ligand material by a carbon-hydrogen insertion reaction to form a cross-linked ligand material; a solubility of the cross-linked ligand material in a solvent is less than a solubility of the ligand material and the cross-linking agent in the solvent.

2. The quantum dot material according to claim 1, wherein a molar extinction coefficient of the cross-linking agent is greater than 1 $cm^{-1}$ $(mol/L)^{-1}$ under ultraviolet light with a wavelength in a range of 200 nm to 400 nm.

3. The quantum dot material according to claim 1, wherein the cross-linking agent is selected from any one of structures represented by a following general formula (I):

(I)

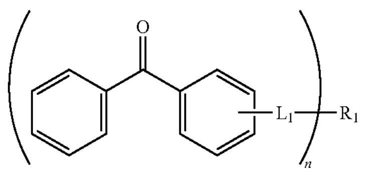

wherein $L_1$ is selected from any one of an amide bond, an ester bond and an ether bond;

$R_1$ is selected from any one of a saturated or unsaturated straight or branched chain $C_1$-$C_{40}$ alkyl, $C_3$-$C_{40}$ cycloalkyl, $C_3$-$C_{40}$ heterocycloalkyl, $C_6$-$C_{40}$ aryl, and $C_6$-$C_{40}$ heteroaryl; and a value of n is greater than or equal to 2.

4. The quantum dot material according to claim 3, wherein the value of n is selected from any one of 2, 3 and 4.

5. The quantum dot material according to claim 3, wherein a benzophenone group of the cross-linking agent represented by the general formula (I) is a photoresponsive group, and a carbonyl group of the benzophenone group is configured to be bonded, under light illumination, to the ligand material through a carbon-hydrogen insertion reaction.

6. The quantum dot material according to claim 1, wherein the ligand material adopts an organic ligand containing an alkyl carbon-hydrogen bond.

7. The quantum dot material according to claim 6, wherein the ligand material includes a coordination group and a carbon-hydrogen insertion group; the ligand material is selected from any one of structures represented by a following general formula (II):

(II)

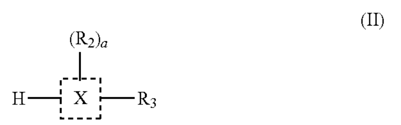

wherein X is any one of a primary carbon group, a secondary carbon group and a tertiary carbon group, and XH is the carbon-hydrogen insertion group;

$R_2$ is selected from any one of a saturated or unsaturated straight or branched chain $C_1$-$C_{40}$ alkyl, $C_3$-$C_{40}$ cycloalkyl, $C_3$-$C_{40}$ heterocycloalkyl, $C_6$-$C_{40}$ aryl, and $C_6$-$C_{40}$ heteroaryl;

$R_3$ is selected from any one of a carboxyl group containing a $C_1$-$C_{40}$ carbon chain, an amino group containing a $C_1$-$C_{40}$ carbon chain, a mercapto group containing a $C_1$-$C_{40}$ carbon chain and an alkyl group containing a phosphorus atom; $R_3$ is the coordination group used to be coordinated to a quantum dot body; and a value of a is any one of 0, 1 and 2.

8. The quantum dot material according to claim 1, wherein the ligand material is selected from any one of organic acids, organic amines, organic phosphorus and organic thiols.

9. The quantum dot material according to claim 1, wherein the quantum dot bodies includes any one of Group IIB-VIA quantum dots, Group IIIA-VA quantum dots, Group IVA-VIA quantum dots, quantum dots with a core-shell structure and perovskite quantum dots.

10. The quantum dot material according to claim 1, wherein a mass ratio of the cross-linking agent to the quantum dot bodies is in a range of 0.005 to 0.5; and a mass ratio of the cross-linking agent to the ligand material is in a range of 0.05 to 5.

11. The quantum dot material according to claim 1, wherein a dielectric constant of the solvent is less than 10.

12. A quantum dot material, comprising:

quantum dot bodies and a ligand material coordinated to the quantum dot bodies; and a cross-linking agent, the cross-linking agent including at least two photoresponsive groups and a linking group bonding the at least two photoresponsive groups; wherein a structure of the cross-linking agent is selected from any one of structures represented by a following general formula (I);

(I)

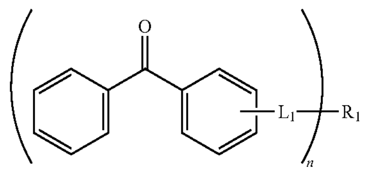

wherein $L_1$ is selected from any one of an amide bond, an ester bond and an ether bond;

$R_1$ is selected from any one of a saturated or unsaturated straight or branched chain $C_1$-$C_{40}$ alkyl, $C_3$-$C_{40}$ cycloalkyl, $C_3$-$C_{40}$ heterocycloalkyl, $C_6$-$C_{40}$ aryl, and $C_6$-$C_{40}$ heteroaryl; and a value of n is greater than or equal to 2; and the ligand material adopts an organic ligand containing an alkyl carbon-hydrogen bond.

13. A light-emitting device, comprising: a light-emitting layer, wherein the light-emitting layer includes a cross-linked quantum dot material with a network structure formed by the quantum dot bodies, the ligand material, and the cross-linking agent in the quantum dot material according to claim 1.

14. The light-emitting device according to claim 13, wherein the cross-linked quantum dot material is selected from any one of structures represented by a following general formula (III);

(III)

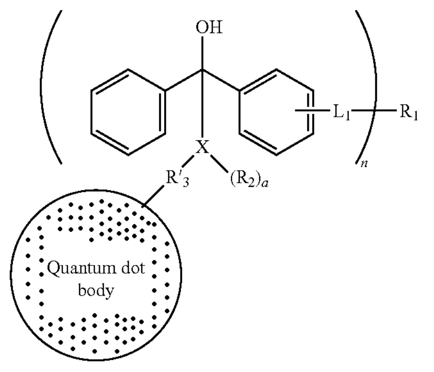

wherein $L_1$ is selected from any one of an amide bond, an ester bond and an ether bond;

$R_1$ is selected from any one of a saturated or unsaturated straight or branched chain $C_1$-$C_{40}$ alkyl, $C_3$-$C_{40}$ cycloalkyl, $C_3$-$C_{40}$ heterocycloalkyl, $C_6$-$C_{40}$ aryl, and $C_6$-$C_{40}$ heteroaryl;

a value of n is greater than or equal to 2;

X is any one of a primary carbon group, a secondary carbon group and a tertiary carbon group;

$R_2$ is selected from any one of a saturated or unsaturated straight or branched chain $C_1$-$C_{40}$ alkyl, $C_3$-$C_{40}$ cycloalkyl, $C_3$-$C_{40}$ heterocycloalkyl, $C_6$-$C_{40}$ aryl, and $C_6$-$C_{40}$ heteroaryl;

$R'_3$ is a group formed after a coordinating group $R_3$ is coordinated to the quantum dot body, $R_3$ is selected from any one of a carboxyl group containing a $C_1$-$C_{20}$ carbon chain, an amino group containing a $C_1$-$C_{20}$ carbon chain, a mercapto group containing a $C_1$-$C_{20}$ carbon chain and an alkyl group containing a phosphorus atom, and $R'_3$ is selected from any one of a structure where one hydrogen is removed from a carboxyl group, an amino group, a mercapto group or an alkyl group containing a phosphorus atom in $R_3$; and a value of a is any one of 0, 1 and 2.

15. The light-emitting device according to claim 14, wherein each quantum dot body in the cross-linked quantum dot material is bonded to a plurality of groups $R'_3$, and the quantum dot bodies in the cross-linked quantum dot material are bonded by the cross-linking ligand material.

16. The light-emitting device according to claim 13, wherein the light-emitting layer includes a first sub-pixel film layer, a second sub-pixel film layer and a third sub-pixel film layer, and the first sub-pixel film layer, the second sub-pixel film layer and the third sub-pixel film layer are sequentially arranged in a first direction; wherein the first direction is perpendicular to a plane where the light-emitting layer is located.

17. The light-emitting device according to claim 13, further comprising: a first electrode and a second electrode, the light-emitting layer being disposed between the first electrode and the second electrode;

an electron transporting layer, the electron transporting layer being disposed between the first electrode and the light-emitting layer; and a hole injection layer and a hole transporting layer, the hole injection layer and the hole transporting layer are stacked between the second electrode and the light-emitting layer, and the hole injection layer and the hole transporting layer being sequentially arranged in a direction far away from the second electrode.

18. A display apparatus, comprising the light-emitting device according to claim 13.

19. A method of manufacturing a light-emitting device, comprising forming a light-emitting layer;

forming the light-emitting layer includes:

performing a coating process with a quantum dot material, wherein the quantum dot material includes the quantum dot material according to claim 1;

performing an exposure process on the quantum dot material under ultraviolet light; and performing a development process with a developing solution to form the light-emitting layer.

20. The method of manufacturing the light-emitting device according to claim 19, wherein:

the quantum dot material includes a first quantum dot material, a second quantum dot material and a third quantum dot material;

the light-emitting layer includes a first sub-pixel film layer formed by the first quantum dot material, a second sub-pixel film layer formed by the second quantum dot material, and a third sub-pixel film layer formed by the third quantum dot material;

forming the first sub-pixel film layer, the second sub-pixel film layer and the third sub-pixel film layer include:

performing a coating process with the first quantum dot material;

performing an exposure process on the first quantum dot material under ultraviolet light;

performing a development process with a developing solution to form the first sub-pixel film layer;

performing a coating process with the second quantum dot material;

performing an exposure process on the second quantum dot material under ultraviolet light;

performing a development process with a developing solution to form the second sub-pixel film layer;

performing a coating process with the third quantum dot material;

performing an exposure process on the third quantum dot material under ultraviolet light; and performing a development process with a developing solution to form the third sub-pixel film layer to obtain the light-emitting layer.

* * * * *